(12) United States Patent
Umezu et al.

(10) Patent No.: US 6,418,391 B1
(45) Date of Patent: Jul. 9, 2002

(54) TESTING SYSTEM FOR PERFORMING AN OPERATION OF AN APPLICATION WHICH CONTROLS TESTING EQUIPMENT FOR TESTING A DEVICE UNDER TEST AND METHOD FOR CONTROLLING THE SAME

(75) Inventors: Satoshi Umezu; Takahiro Yamaguchi; Jun Miyajima, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/166,297

(22) Filed: Oct. 5, 1998

(30) Foreign Application Priority Data

Oct. 10, 1997 (JP) .............................................. 9-293329

(51) Int. Cl.[7] ................................................ G06F 11/22
(52) U.S. Cl. ........................ 702/123; 702/120; 702/119
(58) Field of Search ........................... 702/117–123, 67, 702/68, 108, 182–185, 188, FOR 103, FOR 104, FOR 131, FOR 134, FOR 135, FOR 170, FOR 171; 700/83–87, 79, 81; 345/965, 962, 969, 970, 326, 348, 349, 339

(56) References Cited

U.S. PATENT DOCUMENTS

| | | | | |
|---|---|---|---|---|
| 5,479,643 A | * | 12/1995 | Bhaskar et al. | 345/970 |
| 5,623,592 A | * | 4/1997 | Carlson et al. | 700/83 |
| 5,784,275 A | * | 7/1998 | Sajoodi et al. | 700/86 |
| 5,861,882 A | * | 1/1999 | Sprenger et al. | 345/326 |
| 6,002,868 A | * | 12/1999 | Jenkins et al. | 345/967 |

* cited by examiner

*Primary Examiner*—Hal Wachsman
(74) *Attorney, Agent, or Firm*—Dellett and Walters

(57) ABSTRACT

There is disclosed a testing system for performing an operation of an application which controls testing equipment for testing a device under test by displaying images such as icons or buttons on a screen, and selecting these images with use of a pointing device, and a method for controlling the testing system. An icon corresponding to the device under test and an icon corresponding to a test element are displayed, and then connected and displayed. In addition, a test parameter is generated corresponding to each test element, a test is conducted by setting respective test parameters, and obtained test data is displayed.

12 Claims, 24 Drawing Sheets

FIG. 20
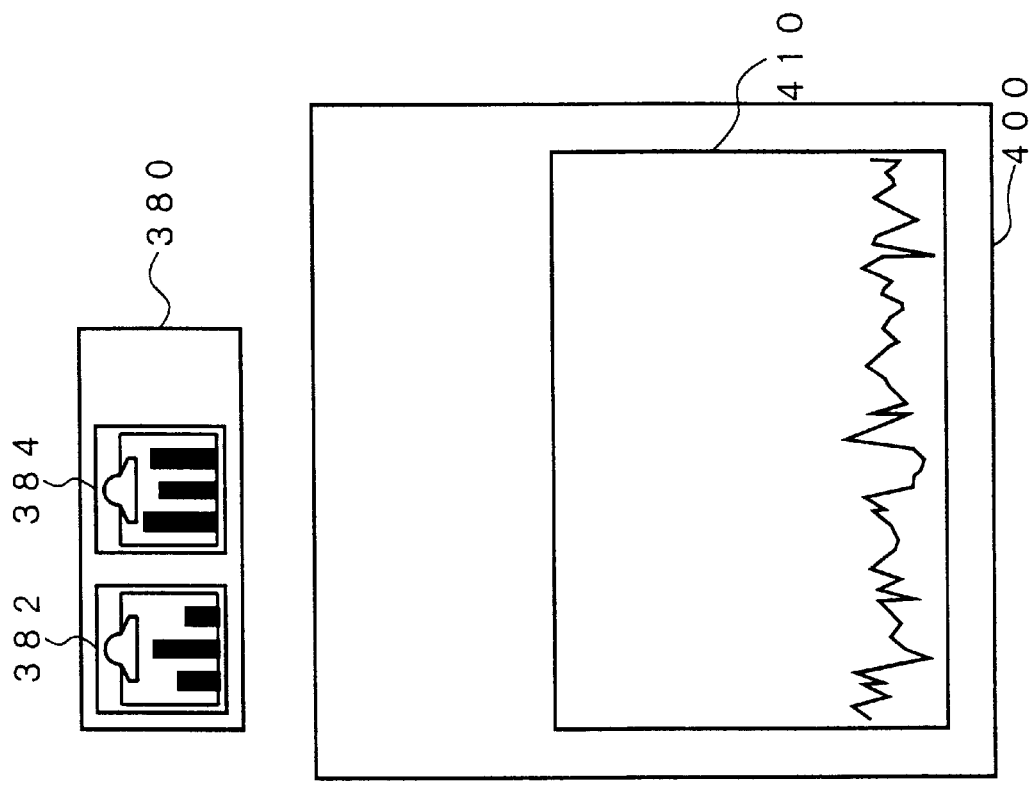
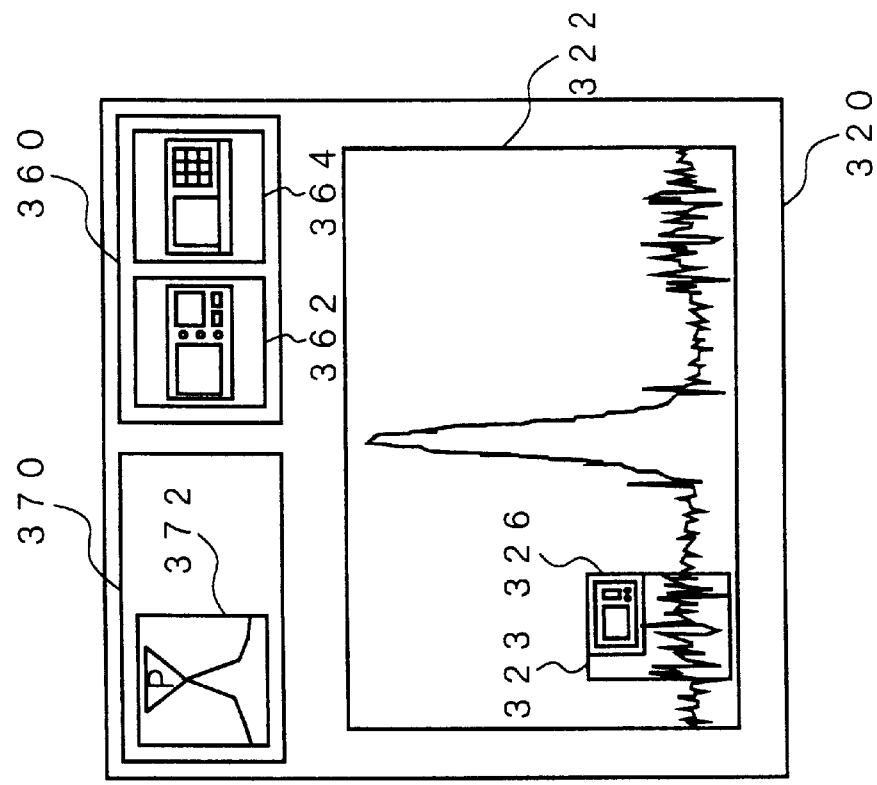

TESTING SYSTEM FOR PERFORMING AN OPERATION OF AN APPLICATION WHICH CONTROLS TESTING EQUIPMENT FOR TESTING A DEVICE UNDER TEST AND METHOD FOR CONTROLLING THE SAME

BACKGROUND OF THE INVENTION

The present invention relates to a testing system which tests a device under test by interconnecting a test controller and one or more test units, and its controlling method. In this specification, a device under test (DUT) means a device, system, equipment, or component of equipment to be tested by the testing system according to the present invention. The test includes various actions to be conducted for known test purposes such as manufacturing evaluation, quality control, correction, calibration, alignment, adjustment, performance evaluation, diagnostics, and product incoming inspection.

In addition, a "testing apparatus" used herein includes one or more electronic equipment such as a signal generator, modulator, demodulator, input/output device, amplifier, mixer, coder, decoder, oscilloscope, strain gauge, wattmeter, multimeter, attenuator, detector, spectrum analyzer, network analyzer, semiconductor test device, synthesizer, thermostat oven, or measuring device, or a passive or active device or instrument necessary for performing evaluation, test, calibration, repair, adjustment or the like for evaluating an electronic device.

A "test task" used herein includes a test item, a test condition, tradeoff of a test whether the test is conducted at a high speed or at a high accuracy, a test element, and a test. Here, the test item indicates an item for testing a DUT such as high harmonics measurement. A test condition described by taking the above-mentioned high harmonics measurement as an example consists of parameters of the test item such as a fundamental harmonic frequency and the order of high harmonics to be measured, and test parameters of test elements utilized in the test. In addition, a test result corresponding to the test item is data obtained by performing an operation corresponding to the test item on test data obtained from the test element. For example, when described by taking the above-mentioned high harmonics measurement as an example, a power ratio between the fundamental harmonic and the high harmonics is the test result corresponding to the test item.

Moreover, a "program element" used herein includes the test tasks mentioned above, and conditions for controlling the execution order of test tasks such as begin, end, pause, wait, wait for specifying a start time, a loop for combining them, and a condition loop.

In addition, a "memory" used herein includes a RAM, ROM and EPROM, a permanent record storage device such as a floppy disk, hard disk and CD-ROM, and any other storage means known in the art.

It is necessary to use a plurality of testing device such as a spectrum analyzer or network analyzer to test a personal handy phone system (PHS) or cellular system. In such testing environment, a user of the testing system is not skilled in all of testing devices.

A conventional testing system employs an approach for visualizing a test program to provide environment which allows a person unskilled in the testing device to use the test program. Visualization means a scheme which represents a program as a collection of pictographs called icons each of which is a program part performing acquisition of or operation on data, or display of a graph, and specifies an order of program execution by connecting displayed icons with use of a pointing device with a push button on a screen of a computer as the testing apparatus.

A user of the testing system selects these icons stored in a menu or a toolbox by pointing (pressing the push button of the pointing device, and releasing the push button without moving the pointing device) a desired one with the pointing device with a push button. Then, pointing is performed again on a window screen for programming to place the selected icon on the screen. Several predetermined connection points are set to each icon, and connection is attained by pointing a connection point of icon corresponding to a connection start and a connection point of icon corresponding to a connection end with the pointing device with the push button.

(a) Attaining Testing System Starting Operation from Selection of Purpose/goal

As described above, a programming method of a conventional testing system employs an approach to connect program parts which performs data acquisition, arithmetic operation or graph representation by pointing points predetermined for respective icons and connecting them. Such connection approach has a problem that the user cannot effectively use the system unless he/she thoroughly understands a function of each icon, and a function of each connection point. Therefore, the user of the testing system concentrates much effort on a programming method of "how to combine programming parts provided by the testing system," rather than considering a method for evaluating a DUT.

In particular, when it is intended to conduct a proper test in environment where a DUT cannot be tested unless a plurality of testing devices are used, a testing system is required which allows the user to concentrate his/her attention on detailed evaluation of the DUT even if he/she does not fully understand the testing system.

If there is a testing system which the user can start operation by selecting an object or goal of the test, he/she can concentrate his/her attention of how the DUT is evaluated. Thus, it is desired to have a testing system which can be operated by selecting a purpose or goal of a test.

(b) Attaining Testing System on which High Speed Testing or Highly Accurate Testing can be Specified In utilizing a testing device or testing system, it is necessary to alternatively select whether the test is conducted at a high speed or at a high accuracy. There is a tradeoff between higher testing speed and higher testing accuracy. That is, if the test is conducted at a high speed, test accuracy should be sacrificed. contrary, if the test is conducted at a high accuracy, it takes a longer period of time.

However, such tradeoff between high speed testing and high accuracy testing has not been clear in the conventional testing system. Therefore, the user cannot attain detailed setting corresponding to the tradeoff on "how to use the testing device" unless he/she conducts the test with several trials and errors. In addition, there is problem that even such trial and error testing cannot be conducted unless the user fully understands the hardware configuration of the testing device and corresponding test parameters.

Thus, it is also desired to have a testing system which allows it to easily specify the tradeoff of high speed/high accuracy testing even if the user does not fully understand the detailed internal configuration of the testing system or device and the test parameters.

(c) Attaining Testing System in which, when Certain Coordinates are Specified on a Graph Representation as a Test Result, a Service is Started in Accordance with the Specified Region It is requested for the testing system to represent test data of a DUT in a graph, which allows it to obtain, for example, a power value of unexpected spurious fast and at a high accuracy. However, for example, if it is intended to obtain a power value of spurious with the conventional testing system, it is necessary to perform programming and operation again such as (1) terminating the test, (2) building a program for adding test data, and (3) conducting the test again to find the power value. In this case, if the spurious from which the power is determined is a part of test data, it is necessary to locate array data in the corresponding test data from the positional coordinates of spurious on the graph representation, and to add a program which adds the located array data. As such, the conventional testing system requires much effort only even in finding the power value of spurious on the graph representation.

Thus, it is convenient if there is a testing system in which, when certain coordinates are specified on a graph representation as a test result, a service is started in accordance with the specified region.

(d) Attaining Testing System in which a New Test Parameter for a Test Element can be Generated from a Specified Region on a Graph Representation of a Result Obtained from the Test Element, and Start a New Test with the Generated Test Parameter When a frequency of unexpected spurious as described above is analyzed in detail, retesting becomes necessary using a frequency range including the spurious as a new test parameter. Particularly, in the case of spurious or the like, there arises a problem on the level or frequency of spurious for a level of signal which is the primary object of the test. Thus, environment is required in which the signal level which is the primary object of the test and spurious can be simultaneously displayed and compared.

Even the conventional testing system may implement environment in which a test parameter can be set again by displaying an instrument panel, and creating a program for controlling hardware for the central frequency and span. However, to analyze a plurality of unexpected spurious, the user of the testing system needs to modify the program and to adjust test parameters such as the central frequency and span on the instrument panel being displayed so that an instrument panel for controlling new hardware can be newly displayed.

If there is a mechanism in which, when spurious is found on the graph representation, a new test parameter can be generated by specifying the range of found spurious on the graph representation, the user of the testing system need not modify the test program every time spurious is found. In addition, if the automatically generated test parameter is automatically set on an instrument for analyzing the spurious, the user of the testing system need not read the frequency of spurious or the like from the graph representation, and set the test parameter on the newly created instrument panel. These functions can significantly reduce burden on the user of the testing system. Consequently, the user of the testing system can concentrate on the analysis of spurious without being bothered by modification of the program. However, the conventional testing system does not provide such function.

Thus, it is desired to have a testing system which can generate a new test parameter of a test element from a specified range on a graph representation of the result obtained from the test element without reprogramming a program, and start a new test with the generated test parameter.

(e) Attaining Testing System in which a New Test Parameter for Another Test Element can be Generated from a Specified Region on a Graph Representation of a Result Obtained from a Test Element, and Start a New Test for Another Test Element with the Generated Test Parameter To perform analysis of spurious as described above, it is required to provide testing equipment such as a spectrum analyzer, a frequency counter, or a power meter. If evaluation can be attained with appropriate testing equipment when these testing equipment are connected to the testing system, the analysis can be efficiently performed at a required test accuracy. When spurious is detected during a test with a spectrum analyzer, if another test can be conducted using a frequency. counter from a range on graph representation for spurious to be analyzed, the frequency of spurious can be tested at a high accuracy.

When spurious is found on the graph representation, if a test parameter for analyzing the spurious is automatically generated from a specified range on the graph representation, and automatically set in a test element for analyzing the spurious, the user of the testing system need not read the frequency of spurious or the like from the graph representation on which the spurious is found, and manually set the test parameter on the newly created instrument panel. Consequently, the user of the testing system can concentrate his/her attention on the analysis of spurious without being bothered by modification of the program. However, the conventional testing system does not provide such function.

Thus, it is desired to have a testing system which can generate a new test parameter of another test element without reprogramming a program, and start a new test corresponding to another test element with the generated test parameter.

The present invention is devised in view of the above. Its first object is to provide a testing system which can start operation by selecting an object or goal of a test. In addition, a second object of the present invention is to provide a testing system which can specify whether a test is conducted at a high speed or at a high accuracy. A third object of the present invention is to provide a testing system which can start a service adapted to a specified range without reprogramming a program when certain coordinates are specified on a graph representation as a test result. A fourth object of the present invention is to provide a testing system which can generate a new test parameter of a test element from a specified range on a graph representation of the result obtained from the test element without reprogramming a program, and start a new test with the generated test parameter. A fifth object of the present invention is to provide a testing system which can generate a new test parameter of another test element from a specified range on a graph representation of the result obtained from the test element without reprogramming a program, and start a new test with the generated test parameter, as well as a control method therefor.

SUMMARY OF THE INVENTION

In one preferred embodiment, the testing system of the present invention combines test task means, test parameter storage means, test data storage means, virtual instrument means, representation sheet means, and test class means, whereby operation can be started by back tracking from a test purpose/goal, and can set tradeoff whether the test is conducted at a high speed or at a high accuracy only by specifying a test purpose/goal.

In addition, a function which can start a service adapted to a specified range when certain coordinates are specified on a graph representation as a test result can be attained by adding slot information means and virtual instrument service means to the above combination. Alternatively, when slot means and interactor means are added to the above combination, there are attained functions of a) generating a new test parameter for a test element from a specified range on a graph representation which is a result obtained from the test element without reprogramming a program, and starting a new test with the generated test parameter; and b) generating a new test parameter for a test element from a specified range on a graph representation which is a result obtained from another test element, and starting a new test with the generated test parameter.

In addition, when test plan means is added to the above combination, it becomes possible to combine a program element or a composite program element, thereby being capable of writing and running a program which can set an order for executing test tasks or control the order of execution.

BRIEF DESCRIPTION OF THE DRAWINGS

FIG. 20 is an example of GUI implementation for generating a new test parameter from a specified range on a graph representation of a test result, and starting the test;

DESCRIPTION OF THE PREFERRED EMBODIMENT

Prior to describe the present invention in detail, the concept of object is described.

(1) Inheritance of Object

Figure 1:
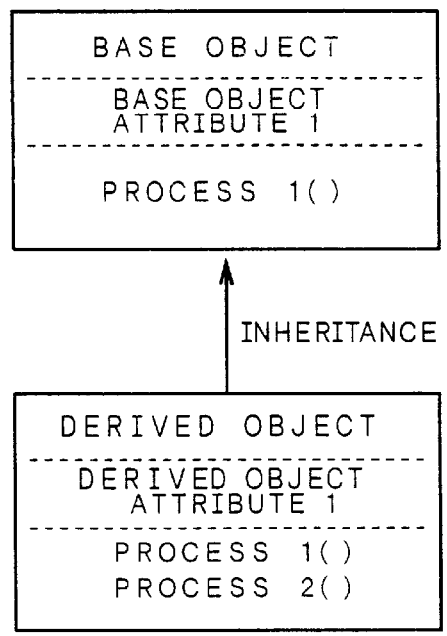
FIG. 1 is a diagram showing inheritance of objects.
Figure 2:
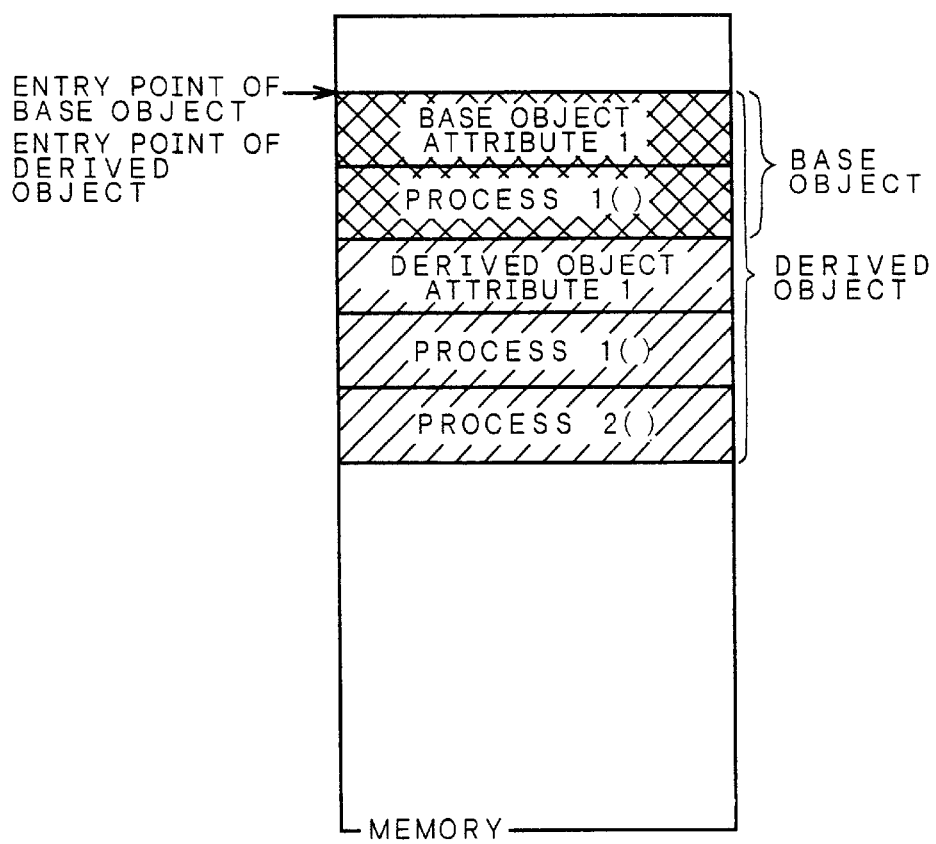
FIG. 2 is a diagram showing a memory configuration for a base object and a derived object.

An object is an attribute (data) integrated with a process, and stored in a memory. FIG. 1 is a diagram showing inheritance of objects. In addition, FIG. 2 is a diagram showing a configuration of objects on a memory. As shown in FIG. 1, an arrow denoted as "inheritance" is drawn from a derived object to a base object. This indicates that the derived object is an object inherited from the base object. FIG. 2 shows a configuration of the base object and the derived object in such relationship on the memory.

A derived object has a base object at its top. Thus, an entry point of a derived object indicates the same address at that of an entry point of a base object which the derived object has therein. That is, a derived object can be treated as a base object. As described, the fact that a derived object has a base object at the top of a memory is expressed as a derived object inherits a base object. In addition, when a derived object inherits a base object, it is expressed that the base object is called a parent object, the derived object a child object.

In an example shown in FIG. 2, two 'process 1' are implemented in a derived object. 'Process 1' near an entry point of the derived object on the memory is a process defined by a base object. Another 'process 1' is a process defined by the derived object.

When 'process 1' is requested to the derived object, 'process 1' defined by the derived object is executed in the following procedure.
(a) Execution of 'process 1' is requested to an object;
(b) The object searches the requested process from a child object to a parent object; and
(c) The object detects a process the name, return value and argument of which match those of the requested process, and executes it.

Thus, even when the derived object is treated as the base object, if execution of 'process 1' is requested, 'process 1' defined by the derived object is executed. However, even for a child object, a parent object can be executed by specifying the parent object. In addition, if 'process 1' is not implemented in a parent base object, execution of 'process 1' cannot be requested to an object which is treated as the base object. It is only a process defined in the base object that can request execution to the base object.

A derived object can reference or modify the content of 'base object attribute 1' which a base object has.

(2) Association of Object

Figure 3:
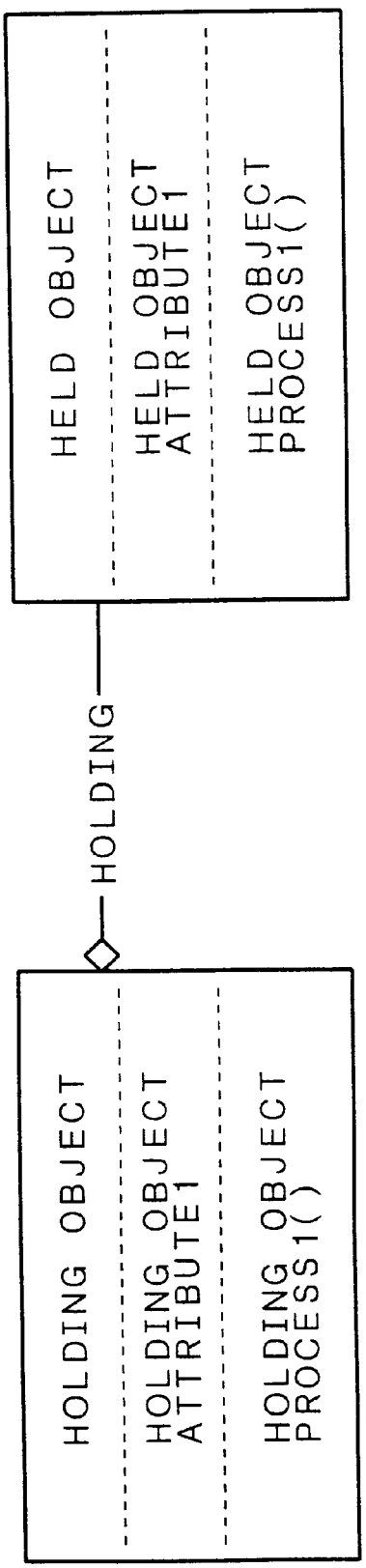
FIG. 3 is a diagram showing an example of representation of associating objects.
Figure 4:
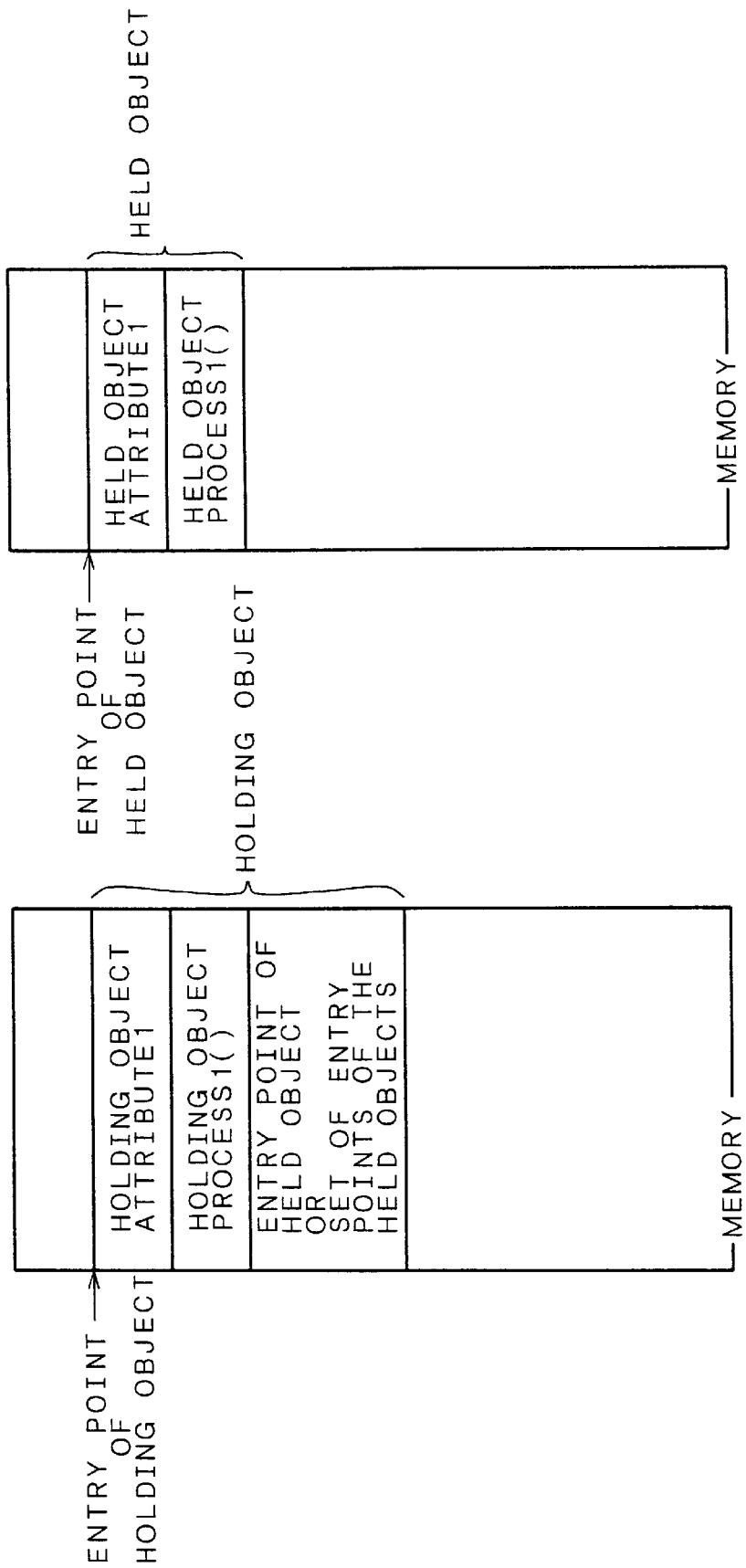
FIG. 4 is a diagram showing a memory configuration for an associating object and an associated object.

FIG. 3 is a diagram showing an example of representation of associating objects. In FIG. 3, a line denoted as "association" is drawn from a "associating object" to a "associated object," with a diamond being shown at the "associating object." This represents that the "associating object" associates the "associated object." FIG. 4 shows the configuration of such "associating object" and "associated object" on a memory.

When the "associating object" has only one "associated object," an entry point of the "associated object" on the memory is stored on the memory of "associating object." In addition, when the "associating object" has a plurality of associated objects, a set of entry points (array data) of the "associated objects" on the memory is stored on the memory of the "associating object." With this structure, the associating object can obtain the entry point on the memory of associating object by referencing the memory which the associating object manages, and can start a process which the associated object has.

In addition, even a child object of "associated object" can be associated as a "associated object" of a parent. Moreover, a child object of the "associating object" can reference an object associated by a "associating object" held therein, or modify an object which it associates.

Now, detail of the present invention is described.
[Test task means]

Since the conventional testing system cannot select a test purpose/goal, much effort is required in implementing a program, so that emphasis cannot be placed on detail of evaluation on a DUT. In addition, in the conventional testing system, the user can find detailed setting for the testing system accommodating the tradeoff whether the test should be conducted at a high speed or high accuracy only after he/she makes several trials and errors. To solve these problems, the present invention provides new test task means.

The test task means is to provide GUI for defining a test purpose/goal. The test task means stores a test element specified for conducting a test, and at least one test goal.

The test goal includes a test item, a test condition, tradeoff whether the test should be conducted at a high speed or high accuracy, or the like. Then, in response to a request from the user of the testing system, a test goal specified with at least one test item is sent to virtual instrument means, where measurement is started.

Figure 5:
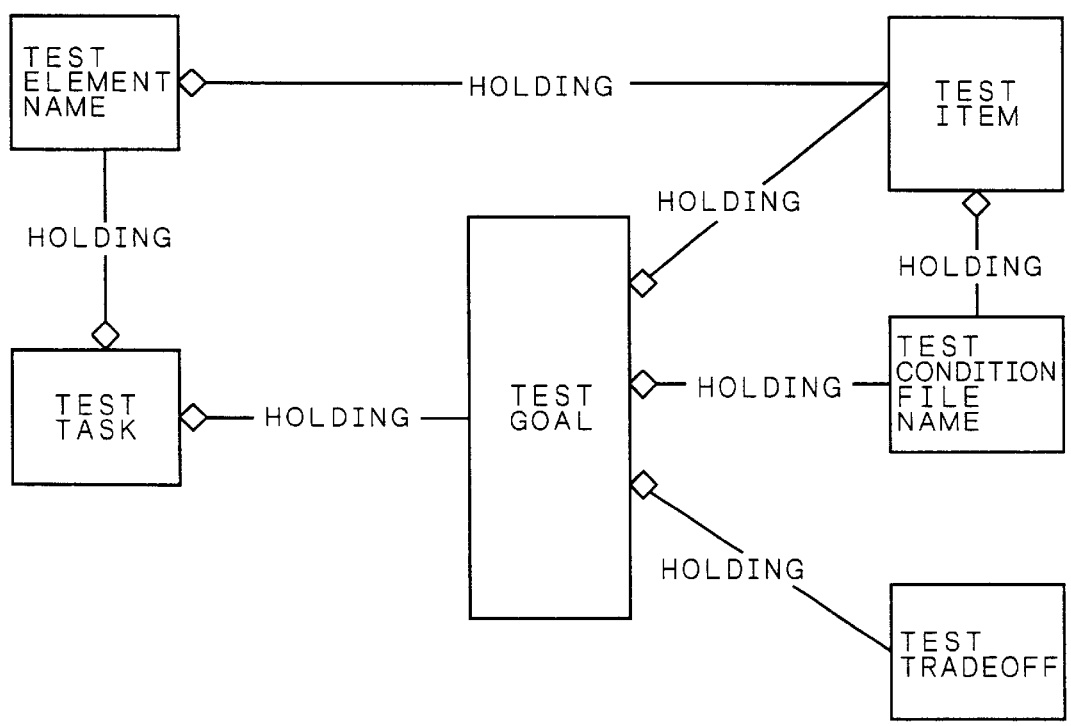
FIG. 5 is a diagram showing a configuration of a base object necessary for implementing test task means.

FIG. 5 is a diagram showing a configuration of a base object necessary for implementing test task means. As shown in FIG. 5, base objects implementing the test task means include a "test item," a "test condition file name," "test tradeoffs," a "test goal," a "test element name," and a "test task." Now, each object is described.

"Test item":

It is an object for storing a test item name on the memory as an attribute. The "test item" associates a "test condition file name" which stores on the memory a test condition which the user of the testing system can utilize in a test item when he/she specifies the test item. The "test item" has a function for displaying a "test item" icon.

"Test condition file name":

It is an object for storing a name of test condition on the memory as an attribute. The "test condition file name" has a function for displaying a "test condition file name" icon.

"Test tradeoff":

It is an object for storing test tradeoff information whether the test is conducted at a high speed or high accuracy on the memory as an attribute. The "test tradeoff" has a function for displaying a test element icon corresponding to a high speed test or a high accuracy test by referencing a test element name which the test task stores.

"Test goal":

It is an object for associating a test condition, test tradeoff, and a test item.

"Test element name":

It is an object for storing a name of test element utilized in the test on the memory as an attribute. In addition, it associates a plurality of "test items" which can be utilized in a test element. For example, there also exists a test element such as a frequency counter the test item of which is defined by a default value having only one test item. Representing such test element, the "test element name" stores a "test item" started as a default on the memory as an attribute. The "test element name" has a function for displaying an icon representing the test element.

"Test task":

The "test task" is an object for associating a plurality of "test goals" and one "test element name." The "test task" is one of program elements, and has 'execute' process. The 'execute' process of the "test task" starts the test by sending a "test goal" which it has to a derived object of "virtual instrument" corresponding to the "test element name" which it associates.

The "test task" associates a plurality of "test goals" and one "test element name," thereby providing GUI for defining a test purpose/goal.

Figure 6:
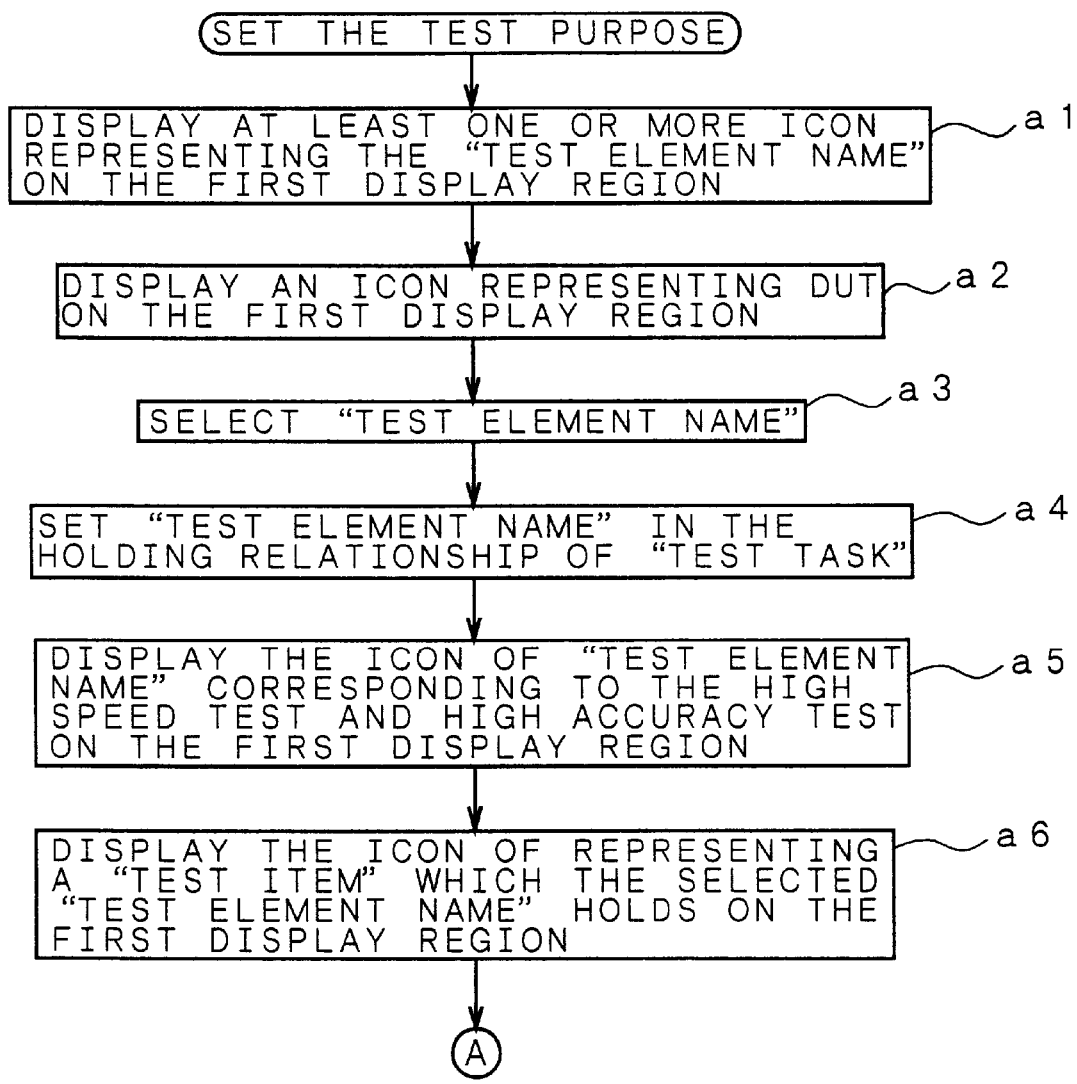
FIG. 6 is a flowchart showing steps of a process provided by the test task means.
Figure 7:
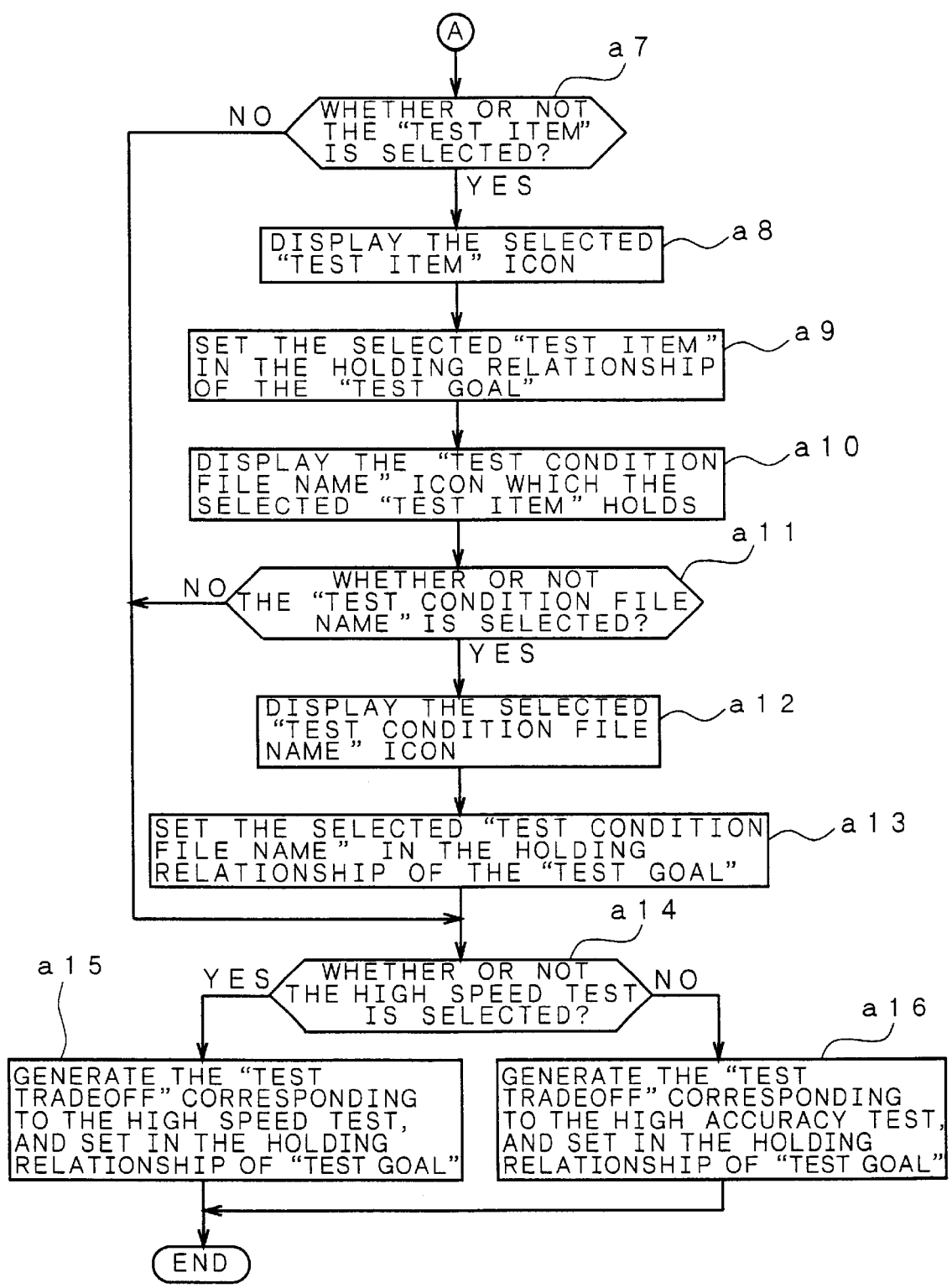
FIG. 7 is a flowchart showing steps of a process provided by the test task means.

FIGS. 6 and 7 are a flowchart showing steps of a process provided by the test task means. Here, the test task means generates a first display region which can be overlap-displayed on the graphical display.

First, the test task means displays at least one icon representing the "test element name" on the first display region (step a1), and also an icon representing DUT on the first display region (step a2).

In this state, the user of the testing system selects a "test element name" utilizing the pointing device (step a3). The test task means sets the selected "test element name" in the association relationship of the "test task" (step a4), and displays icons of "test element names" corresponding to the high speed test and the high accuracy test (step a5). Then, the test task means displays on the first display region an icon representing a "test item" which the "test element name" associates (step a6).

The test task means determines in this displaying action whether the user of the testing system selects the icon of "test item" (step a7), and, if selected, moves the icon representing the selected "test item" to a position on the first display region where the selected icon is displayed (step a8), and sets the selected "test item" in the "test goal" which the "test task" has so that the "test goal" associates it (step a9). Moreover, the test task means displays on the first display region an icon representing a "test condition file name" which the selected "test item" associates (step a10).

Then, the test task means determines whether the user of the testing system selects an icon of "test condition file name" (step a11). If this icon is selected, then the test task means moves the icon representing the selected "test condition file name" to a position on the first display region where the selected icon is displayed (step a12), and sets the selected "test condition file name" in the "test goal" which the "test task" has for associating (step a13).

Alternatively, when a negative determination is made in step a7 or all described above, the test task means determines whether the user of the testing system selects the high speed test (step a14), and, if so, connects the icon representing the DUT to an icon representing a "test element name" corresponding to the high speed test. When the icon representing the DUT is connected to the icon representing the "test element name" corresponding to the high speed test, the "test task" generates "test tradeoff" which stores the tradeoff information of high speed test on the memory as an attribute, and sets in the association relationship of the test goal which it associates (step a15). Then, the test task means sends the generated "test goal" to the virtual instrument means to start the test.

On the other hand, when the user of the testing system selects the high accuracy test, the test task means connects the icon representing the DUT to the icon representing the "test element name" corresponding to the high accuracy test. When the icon representing the DUT is connected to the icon representing the "test element name" corresponding to the high accuracy test, the "test task" generates "test tradeoff" which stores the tradeoff information of high accuracy test on the memory as an attribute, and causes the test goal to associate the "test tradeoff" (step a16). Then, the test task means sends the generated "test goal" to the virtual instrument means to start the test.

The series of processes described above is to define the purpose of test.

[Test parameter storage means]

Figure 8:
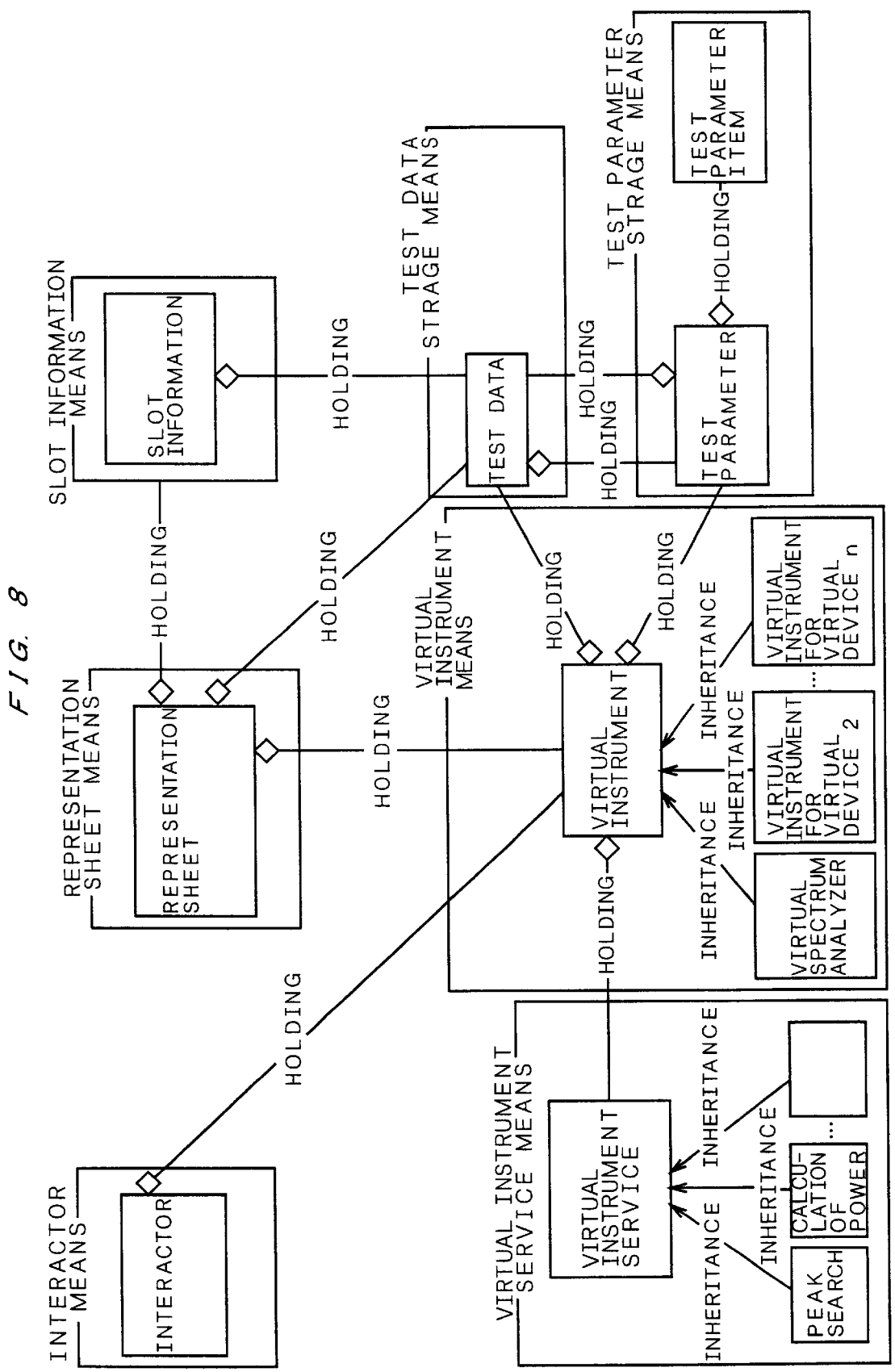
FIG. 8 is block diagram showing configuration of base objects for implementing test parameter storage means, test data storage means, slot information means, representation sheet means, interactor means, virtual instrument service means, and virtual instrument means.

The test parameter storage means stores on the memory test parameters necessary for conducting the test with the test element. FIG. 8 is a diagram showing a configuration of a base object necessary for implementing test parameter storage means. As shown in FIG. 8, base objects implementing the test parameter storage means include a "test parameter item" and a "test parameter." Now, each object is described.

"Test parameter item":

It is an object for storing a "test parameter name" and a "test parameter" on the memory as attributes.

"Test parameter":

It associates at least one or more "test parameter item" necessary for conducting the test with the test element. It also associates one "test data" for storing data obtained by utilizing the "test parameter."

Test data storage means

It stores on the memory data which the virtual instrument acquires in the test. As shown in FIG. 8, a base object implementing the test data storage means is "test data."

"Test data":

It stores on the memory test data which the virtual instrument acquires in the test as an attribute. The "test data" associates one "test parameter" utilized to acquire the test data.

[Virtual instrument means]

The virtual instrument means is to conduct a test from a purpose/goal. The virtual instrument means generates a test parameter from a measurement goal information specified by the test task means by utilizing a test class means, and sends the generated test parameter to a test element to control the test element for conducting the test. Then, it acquires test data from the test element, and stores the acquired data on the memory with the test data storage means. As shown in FIG. 8, a base object implementing the virtual instrument means is a "virtual instrument."

"Virtual instrument":

The "virtual instrument" associates a plurality of "test data" and "test parameters." In addition, it associates a plurality of "representation sheets" for displaying the test result on the graphics display. Furthermore, it associates a plurality of "virtual instrument services" for performing services such as arithmetic operation on the test data. The virtual instrument processes starting of measurement specified with a "measurement goal."

[Representation sheet means]

The representation sheet means is means for representing data acquired from the test element. In addition, it may generate "slot information" from a range specification on the graph representation with the pointing device by combining the test data storage means and the slot information means. As shown in FIG. 8, a base object implementing the representation sheet means is a "representation sheet."

"Representation sheet":

The "representation sheet" associates one "test data" and the "virtual instrument" which acquires the "test data," and represents content of the "test data" in a graph. In addition, the "representation sheet" may generate "slot information" form a range specification on the graph representation with the pointing device. The "representation sheet" associates a plurality of "slot information." The "representation sheet" has a function for supporting an operation on the graph representation that it references an icon of "virtual instrument service" which the associated "virtual instrument" associates or an "interactor" to display available test elements.

[Slot information means]

The slot information means is an object for storing on the memory a range specified on the graph representation by the pointing device. As shown in FIG. 8, a base object implementing the slot information means is "slot information."

"Slot information":

The slot information is an object for storing range data on the memory as an attribute. Then, it associates one "test data" which is a source of the range data. In addition, it has a function for displaying an outer frame of range data on the graph representation of the associated "test data." Moreover, the "slot information" has a function for storing a "virtual instrument service" selected in a range indicated by the range data on the graph representation and a "virtual instrument" on the memory as attributes.

[Virtual instrument service means]

The virtual instrument service means is means for providing services such as arithmetic operation on a range specified on the graph representation of test result. The services such as arithmetic operation on a range on the graph representation is attained by combining the virtual instrument means, the slot information means, the test class means, and the test data storage means. As shown in FIG. 8, a base object implementing the virtual instrument service means is a "virtual instrument service."

"Virtual instrument service":

The "virtual instrument service" is an object for providing a service process such as arithmetic operation on the specified range of test data acquired by the "virtual instrument." It has a 'service process.'

The virtual instrument service includes, for example, a "peak search" for finding a peak value within a specified range of test data, and a "calculation of power" for finding power within a specified range of test data. The "peak search" and "calculation of power" are objects derived from the "virtual instrument service." The "service process" of the "virtual instrument service" is a process defined for child objects such as the "peak search" and "calculation of power." Whether an object being utilized is the "service process" or the "peak search," it is treated as the "virtual instrument service." When the "service process" is executed, the "service process" is executed for the "service process" or the "service process" for "the peak search," so that a result of operation on the "service process" or "peak search" can be obtained.

[Interactor means]

The interactor means is means for performing an inquiry on a new test item, stating a new test, and a graph representation of new test data by combining the virtual instrument means, the slot information means, and the test class means. In addition, it has a function for displaying an icon representing test element available on the testing system. As shown in FIG. 8, a base object implementing the interactor means is an "interactor."

"Interactor":

It utilizes a "virtual instrument" corresponding to a specified "test element name" and a "test class" corresponding to a specified "test item" to generate a "test parameter," and sends the "test parameter" to the "virtual instrument" for testing. The interactor is an object associating a plurality of available virtual instruments.

[Test class means]

The test class means is means for converting a purpose/goal into a test parameter of the test element. In addition, it has a function for calculating a test result corresponding to the test item from the data acquired from the test element by utilizing the converted test parameter. The test class means responses a request from the virtual instrument means or the interactor means to generates test parameters for a specified test element from information such as a test condition, test tradeoff whether the test is conducted at a high speed or high accuracy, or a test range corresponding to X- and Y-axes. In addition, it calculates a test result corresponding to a test item from test data in response to a request from the virtual instrument means.

Figure 9:
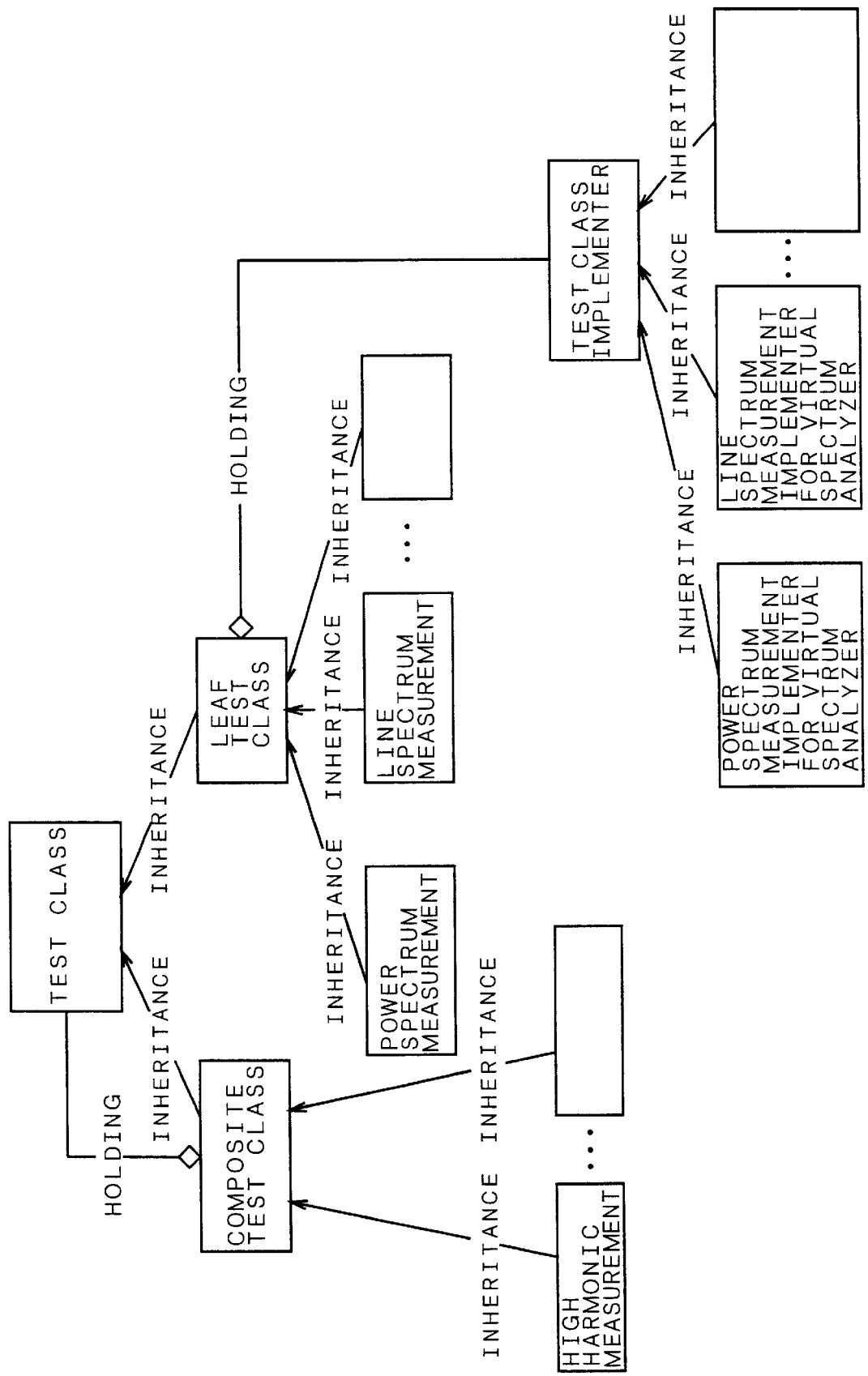
FIG. 9 is a diagram showing a configuration of a base object necessary for implementing test class means.

FIG. 9 is a diagram showing a configuration of a base object necessary for implementing test class means. As shown in the figure, the base objects implementing the test class means include a "test class," a "leaf test class," a "test class implementer," and a "composite test class."

"Test class":

It is an abstract object defining a process which a child object of test class provides. This object defines processes which a child object provides such as generation of test parameters for a specified test element from test condition and information such as a test range corresponding to X- and Y-axes, and calculation of test result corresponding to the measurement item from the test data.

"Leaf test class":

It is an object for generating an abstract test parameter if the test item corresponds to a basic test of the test element. The "leaf test class" further associates one "test class implementer" for converting the abstract test parameter into a test parameter of the "virtual instrument." For example, if the test element is a spectrum analyzer, the "leaf test class" is "power spectrum measurement" for measuring the spectrum in a frequency band, or "line spectrum measurement" for measuring the spectrum at a frequency. Such "power spectrum measurement" or "line spectrum measurement" is an object derived from the "leaf test class."

"Test class implementer":

The "power spectrum measurement" can be measured not only by the spectrum analyzer, but also by several test elements such as an FFT analyzer. These test elements have different test parameters. For example, in the spectrum analyzer, a frequency resolution bandwidth is a test parameter item for determining measurement resolution, while, in the FFT analyzer, the number of display points is a test parameter item for determining the measurement resolution. Thus, there becomes necessary to have an object for converting an abstract test parameter generated by the "leaf test class" into a specific test parameter for each "virtual instrument." The "test class implementer" is an object for converting it into a specific test parameter for each "virtual instrument" by utilizing the "virtual instrument." It is an object derived from the "test class implementer" that is responsible for the conversion into a specific test parameter of the "virtual instrument."

"Composite test class":

It is an object for generating an abstract test parameter if the test item is a combination of basic tests of test element. For example, "high harmonics measurement" is to measure difference of power between a base signal and high harmonics. The "high harmonics measurement" can measure power of each signal with one sweep of the test element if it is measured in a frequency band containing the base signal and high harmonics. In addition, measurement can be made at a high accuracy by separately sweeping the base signal and high harmonics signals with a test element. The former can be measured by the "power spectrum measurement" derived from the "leaf test class." The latter can be measured by the "line spectrum measurement" derived from the "leaf test class." For example, a test for testing the base signal and the high harmonics signal at a high speed with one sweep is called a high speed test, while a test for testing the base signal and the high harmonics signal with separate sweeps at a high accuracy is called a high accuracy test. The "composite test class" is an object associating a plurality of "leaf test classes" for such high speed test and high accuracy test. In addition, the "high harmonics measurement" is an object derived from the "composite test class."

[Test plan means]

Figure 10:
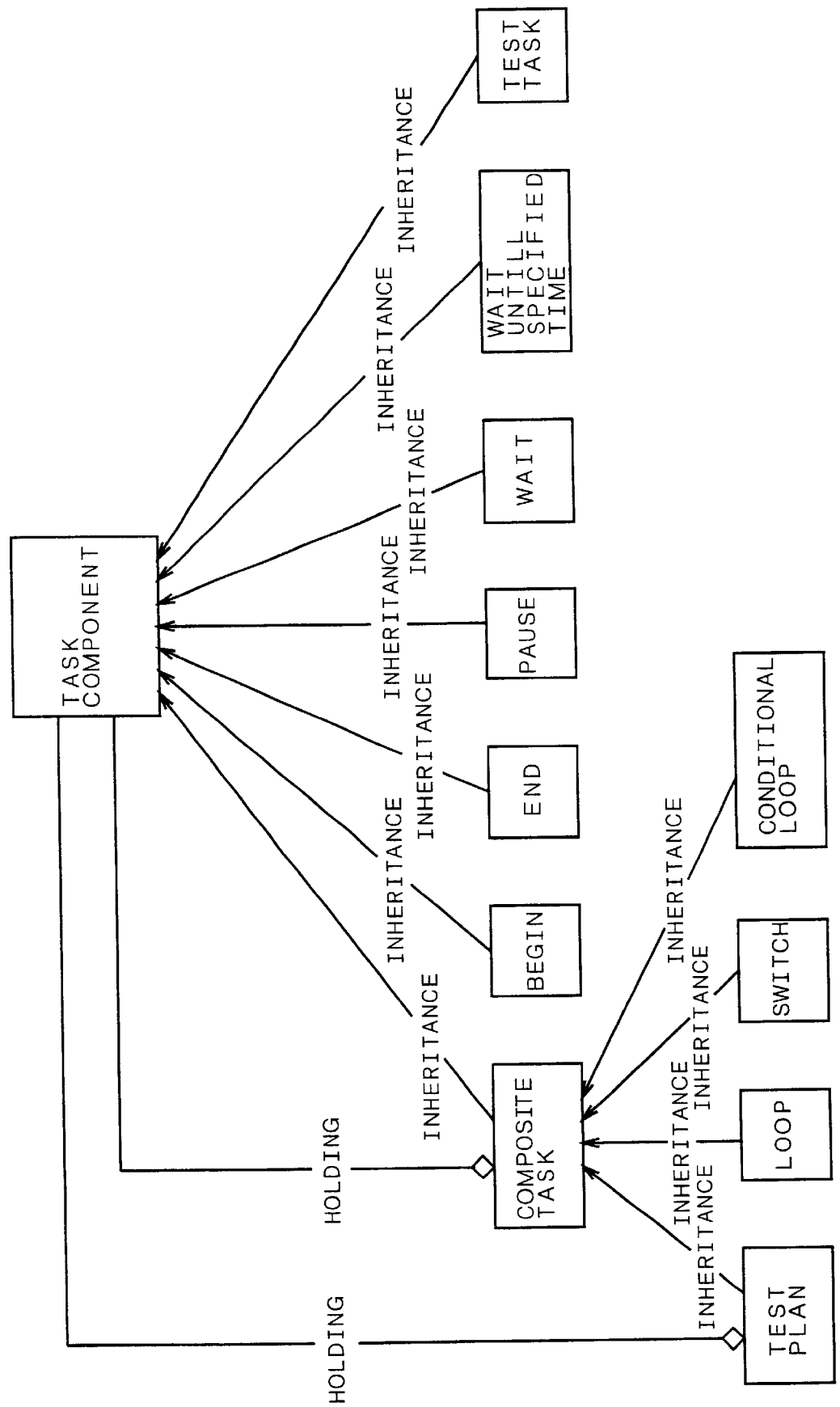
FIG. 10 is a diagram showing a configuration of a base object necessary for implementing test plan means.

The test plan means creates or runs a program providing control the order of execution of test tasks by combining program elements and composite program elements. The test task is one of program elements. The test plan means displays these program elements and composite program elements on the graphics display, thereby providing GUI which allows the user of the testing system to create or run a program. FIG. 10 is a diagram showing a configuration of a base object necessary for implementing test plan means. As shown in the figure, the base objects implementing the test plan means include a "task component," "begin," "end," "pause," "wait," "wait until specified time," "composite task," "loop," "switch," "conditional loop," and "test plan."

"Task component":

It is an object for abstractly treating a program element (all program elements and composite elements being objects derived from the "task component"). The "task component" has an abstract "execute" process. It is an object of program element derived from the "task component" that implements the specific "execute" process. As described above in the "inheritance of object," when a program element derived from the "task component" is treated as a "task component," the "execute" process can be executed even if what the program element is.

"Begin":

It is a program element indicating start of a program. It is a program element having an "execute" process for detecting a "test plan" associating the "begin," and starting the "execute" process of the detected "test plan."

"End":

It is a program element indicating end of a program. The 'execute process' of "end" does nothing.

"Pause":

It is a program element having an 'execute' process which stops a program until there is input from the pointing device.

"Wait":

It is a program element having an 'execute' process which stops a program for a specified period of time. The "wait" stores a program stopping time on the memory as an attribute.

"Wait until specified time":

It is a program element having an 'execute' process which stops a program until a specified time. The "wait until specified time" is stored on the memory as an attribute.

"Composite task":

It is an object for abstractly treating a composite program element. The "composite task" is an object associating a plurality of "task components." The association relationship stores an entry point of each object on the memory as an array data. The 'execute' process of the "composite task" executes the 'execute' processes of the "task components" being associated in an order from the top of the array data.

"Loop":

It is a composite program element having an 'execute' process which executes the 'execute' process of the "composite task" in a specified number of times. The "loop" stores the number of execution on the memory as an attribute.

"Switch":

It is a composite program element having an 'execute' process which starts the 'execute' process of the included "composite task" when a condition is met. The "switch" stores a condition on the memory as an attribute.

"Conditional loop":

It is a composite program element having an 'execute' process of the included "composite task" until a specified condition is reached. The "conditional loop" stores a condition on the memory as an attribute.

"Test plan":

The "test plan" is a program which associates the program elements from the "begin" to the "end" utilizing the "composite task." An 'execute' process of the "test plan" executes the 'execute' process of the included "composite task." The "test plan" associates a plurality of "task components" to store available program elements.

In addition, a "test task" is also a program element derived from the "task component." Programming of a testing system according to the present invention is to build a "test plan." It is only the "test task" that is a program element conducting a test. The program elements other than the "test task" are to control the order of execution of the "test task" or the like.

Figure 11:
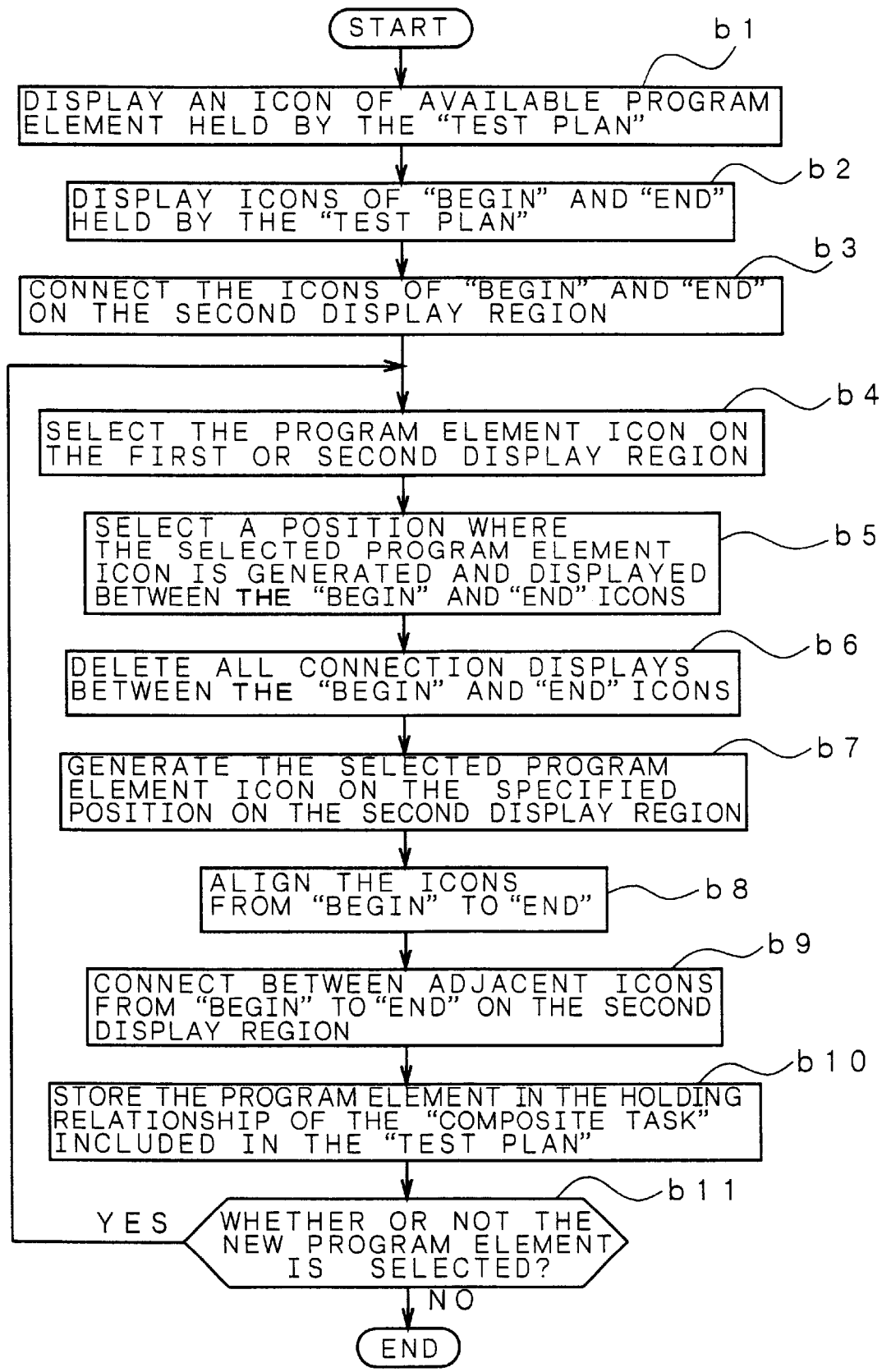
FIG. 11 is a flowchart showing steps of a process provided by the test plan means.

The test plan means utilizes the "test plan" to provide the user of the testing system with GUI for performing such programming. FIG. 11 is a flowchart showing steps of a process provided by the test plan means. The test plan means generates a second display region which can be overlap-displayed on the graphical display. Here, it is assumed that the first display region is generated by the test task means, and an icon of "measurement task" is already displayed on the first display region.

First, the test plan means displays an icon of 'available program element' associated by the "test plan" on the second display region (step b1), displays icons of "begin" and "end" associated by the "test plan" on the second display region (step b2), and connects and displays the icons of "begin" and "end" on the second display region (step b3).

Then, the test plan means selects one of the "test task" icon on the first display region provided by the test task means, or a program element icon displayed on the second display region (step b4). Then, it selects a position where the selected program element icon is generated and displayed between the "begin" and "end" icons (step b5).

Subsequently, the test plan means deletes all connection displays between the "begin" and "end" icons (step b6), and generates the icon of selected program element on a specified position on the second display region. Then, it aligns the icons from "begin" to "end" (step b8), and connects and displays between adjacent icons from "begin" to "end" on the second display region (step b9).

Thereafter, it stores the program element in the association relationship of the "composite task" included on the "test plan" (step b10). In this case, it rearrange the array data of the entry points of program elements to be stored as the association relationship so that the program elements between the icons of "begin" and "end" match the order of display of the icons. If a new program element is further selected, the process returns to step b4 for repetition. A program can be built with such operation.

Now, description is made on functions and advantages which can be attained by combining these means described above.

(1) Combination of Test Task Means, Test Parameter Storage Means, Test Data Storage Means, Virtual Instrument Means, Representation Sheet Means, and Test Class Means (first combination)

The test task means allows it to perform operation from a test purpose/goal. A "virtual instrument" is selected for a test element to be tested as a result of operation, thereby a "test goal" corresponding to the test purpose/goal being generated. The test task means passes the generated "test goal" to the selected "virtual instrument" of the virtual instrument means to start the test.

Display of the test and the test result is performed by the structure which is a combination of the virtual instrument means, the test parameter storage means, the test class means, the test data storage means, and the representation sheet means. First, the "virtual instrument" utilizes a "test class" corresponding to a "test item" which the "test goal" passed by the test task means associates to generate a "test parameter." Then, the "virtual instrument" generates "test data" and a "representation sheet" for displaying test data. Subsequently, the "virtual instrument" sets the "test parameter" in the test element, conducts the test by controlling the test element, and obtains test data from the test element. Then, the "virtual instrument" stores the test data obtained from the test element in the "test data," and requests the "representation sheet" of displaying the test data. Finally, the "virtual instrument" utilizes the "test class" to calculate a test result corresponding to the test item from the test data obtained from the test element.

As described, the operation can be performed from the test purpose/goal by combining the test task means, the test parameter storage means, the test data storage means, the virtual instrument means, the representation sheet means, and the test class means, whereby a testing system which conducts a test based on a test purpose/goal and displays a test result (first object) can be attained. Moreover, the test task means can have a function which can specify as a test purpose/goal the tradeoff whether the test is conducted at a high speed or high accuracy (second object).

As described above, a programming method of a conventional testing system employs an approach to connect program parts which performs data acquisition, arithmetic operation or graph representation by pointing points predetermined for respective icons. Such connection approach requires thorough understanding of functions of icons and a function of each connection point, so that this programming method cannot be easily utilized by every one. In addition, such trial and error cannot be conducted unless the user of the testing system fully understands the hardware configuration of the testing device and corresponding test parameters. On the other hand, when these means described above are combined, there can be provided a testing system which utilizes test class means, which generates a test parameter for a test element through selection of a test item, test condition, and test tradeoff whether the test should be conducted at a high speed or high accuracy, which has not been attained by the conventional testing system, whereby it can perform the operation from a test purpose/goal including the test tradeoff, conduct the test based on the test purpose/goal, and display the test result. Consequently, the user of the testing system can conduct the test without thorough knowledge on the hardware configuration of test equipment, or detail of corresponding test parameters and program parts of the testing system, so that he/she can concentrate on the detail of evaluation on DUT.

(2) Combination of Test Task Means, Test Parameter Means, Test Data Storage Means, Virtual Instrument Means, Representation Sheet Means and the Test Class Means, and Slot Information Means and Virtual Instrument Service Means (second combination)

This is a combination of slot information means and virtual instrument service means to the first combination described above. The slot information means together with the representation sheet means enables the user to select a range on a graph representation with a pointing device. In addition, the virtual instrument service means provides services such as calculation within a range specified on the graph representation of test result based on the "slot information." Accordingly, it is possible to attain a function which, when coordinates are specified on a graph representation of test result, can start a service adapted to the specified range. These services are started through an operation on the first display region generated by the test task means on the graphics display. Now, steps are described for starting a service adapted to the specified range.

First, when a range is selected on the graph representation with the pointing device, the "representation sheet" generates "slot information" for storing the specified range on the memory. Then, the "slot information" overlaps and displays an outer frame of selected region on the graph representation.

Then, the "representation sheet" references a "virtual instrument" which it associates. It then displays on the first display region an icon of "virtual instrument service" which the "virtual instrument" associates. Once the "virtual instrument service" is selected, the "slot information" records the selected "virtual instrument service" in the attribute of the "slot information." The "slot information" displays the selected icon on the graph representation, and executes the "service process" which the "virtual instrument service" has.

The "virtual instrument service" performs a service such as calculation on the selected range on the graph representation when the 'service process' is executed, and displays a result from the service on the first display region. That is, the second combination can attain the third object.

However, for example, if it is intended to obtain a power value of spurious with the conventional testing system, it is necessary to perform programming and operation again such as a) terminating the test, b) building a program for adding test data, and c) conducting the test again to find the power value. In this case, if the spurious from which the power is determined is apart of test data, it is necessary to locate array data corresponding to positional coordinates of the test data from the positional coordinates of spurious on the graph representation, and to add a program which adds the located array data. As such, the conventional testing system requires much effort only even in finding the power value of spurious on the graph representation.

On the other hand, according to the second combination, the service such as calculation on the selected range on the graph representation can performed only by specifying coordinates on the graph representation of test result with use of a pointing device, and selecting the icon of "virtual instrument service," thereby the result obtained from the service being displayed on the graphics display.

A power value of spurious which is a part of test data cannot be found by the conventional testing system unless a program described above. However, use of the second combination enables it to perform such operation with only two operations of the pointing device without modifying the program at all.

(3) Combination of Test Task Means, Test Parameter Storage Means, Test Data Storage Means, Virtual Instrument Means, Representation Sheet Means and the Test Class Means, and Slot Information Means and Interactor Means (third combination)

This is a combination of slot information means and interactor means to the first combination described above. The slot information means together with the representation sheet means enables the user to select a range on a graph representation with a pointing device. In addition, the interactor means performs an inquiry on a new test item, starting a new test, and a graph representation of new test data by combining the virtual instrument means, the slot information means, and the test class means. Therefore, it is possible to attain a) a function for generating a new test parameter for a test element from a specified range on the graph representation of test result obtained from the test element without reprogramming a program, and starting a new test with the generated test parameter, and b) a function for generating a new test parameter for a test element from a specified range on the graph representation of test result obtained from another test element, and starting a new test with the generated test parameter. Now, the steps for attaining the above a) and b) are described in the following.

First, when a range is selected on the graph representation with the pointing device, the "representation sheet" generates "slot information" for storing the specified range on the memory. Then, the "slot information" overlaps and displays an outer frame of selected region on the graph representation.

Then, the "representation sheet" references the "interactor." It then displays on the first display region an icon of a "test element name" corresponding to the "virtual instrument service" which the "interactor" associates. Once the "virtual instrument" is selected, the "slot information" records the selected "test element name" in the attribute of the "slot information." The "slot information" displays the selected icon on the graph representation, and requests the "interactor" of measurement within a specified range.

The "interactor" references the selected "test element name," and, if a "test item" started by default is stored in the attribute of the "test element name," starts the measurement with the stored "test item." If a "test item" started by default is not stored in the attribute of the "test element name" when the selected "test element name" is referenced, the "interactor" references a specified "test element name," and displays an icon of "test item" which the "test element name" associates. Then, when the icon of test item is selected, the "interactor" starts measurement with the selected "test item."

First, as the "interactor" starts the measurement, it sends the "slot information" to a "measurement class" corresponding to the "test item," and generates a "test parameter" of a "virtual instrument" corresponding to the selected "test element name." Subsequently, the "interactor" sends the generated "test parameter" to a "virtual instrument" corresponding to the selected "test element name," and receives "test data" as the result of conducted test from the "virtual instrument." Finally, the "interactor" represents the content of "test data" as a graph utilizing the representation sheet means. As such, use of the third combination enables it to attain the fourth and fifth objects.

Incidentally, when frequencies of unexpected spurious are analyzed in detail, for example, the conventional testing system can attain environment allowing resetting test parameters by programming to display an instrument panel, and to control hardware for the central frequency or span. However, to analyze a plurality of unexpected spurious, the user of the testing system needs modify the program and to adjust test parameters such as the central frequency and span on the instrument panel being displayed so that an instrument panel for controlling new hardware can be displayed.

On the other hand, using the third combination, the user can generate a new test parameter of any test element from a specified range on a graph representation of a result obtained from the test element, conduct a new test with the generated test parameter, and display a result obtained from the new test on the graphics display only by specifying coordinates on the graph representation of test result with the pointing device and selecting an icon of "test element name." However, if a test item which is started by default cannot be determined by the test element for starting the new test, an operation is added for selecting the icon of "test item" after selecting the icon of "test element name."

Particularly, while a program should be conventionally modified to analyze a frequency of unexpected spurious or the like, the third combination enables it to attain such operation through operation of the pointing device up to three times, without modifying the program at all.

(4) Combination of Test Task Means, Test Parameter Storage Means, Test Data Storage Means, Virtual Instrument Means, Representation Sheet Means and the Test Class Means, and Test Plan Means (fourth combination)

This is a combination of test plan means to the first combination described above. When the test plan means is added to the above combination, it becomes possible to combine a program element or a composite program element, thereby being capable of writing and running a program which can set an order for executing test tasks or control the order of execution in addition to attainment of the first, the second, the fourth, and the fifth objects.

(5) Combination of Test Task Means, Test Parameter Storage Means, Test Data Storage Means, Virtual Instrument Means, Representation Sheet Means and the Test Class Means, and Slot Information Means, Virtual Instrument Service Means, Interactor Means and Test Plan Means (fifth combination)

This is a combination of slot information means, virtual instrument service means, interactor means and test plan means to the first combination described above. Combination of the test task means, the test parameter storage means, the test data storage means, the virtual instrument means, the representation sheet means and the test class means enables it to attain the first and the second objects, and addition of the slot information means and the virtual service means to them enables it to attain the third object as well. In addition, when the slot information means and the interactor means are further added, the fourth and the fifth objects can be attained. Moreover, when the test plan means is added, it becomes possible to combine a program element or a composite program element, thereby being capable of setting an order of execution of the test tasks, and controlling the order of execution.

Figure 12:
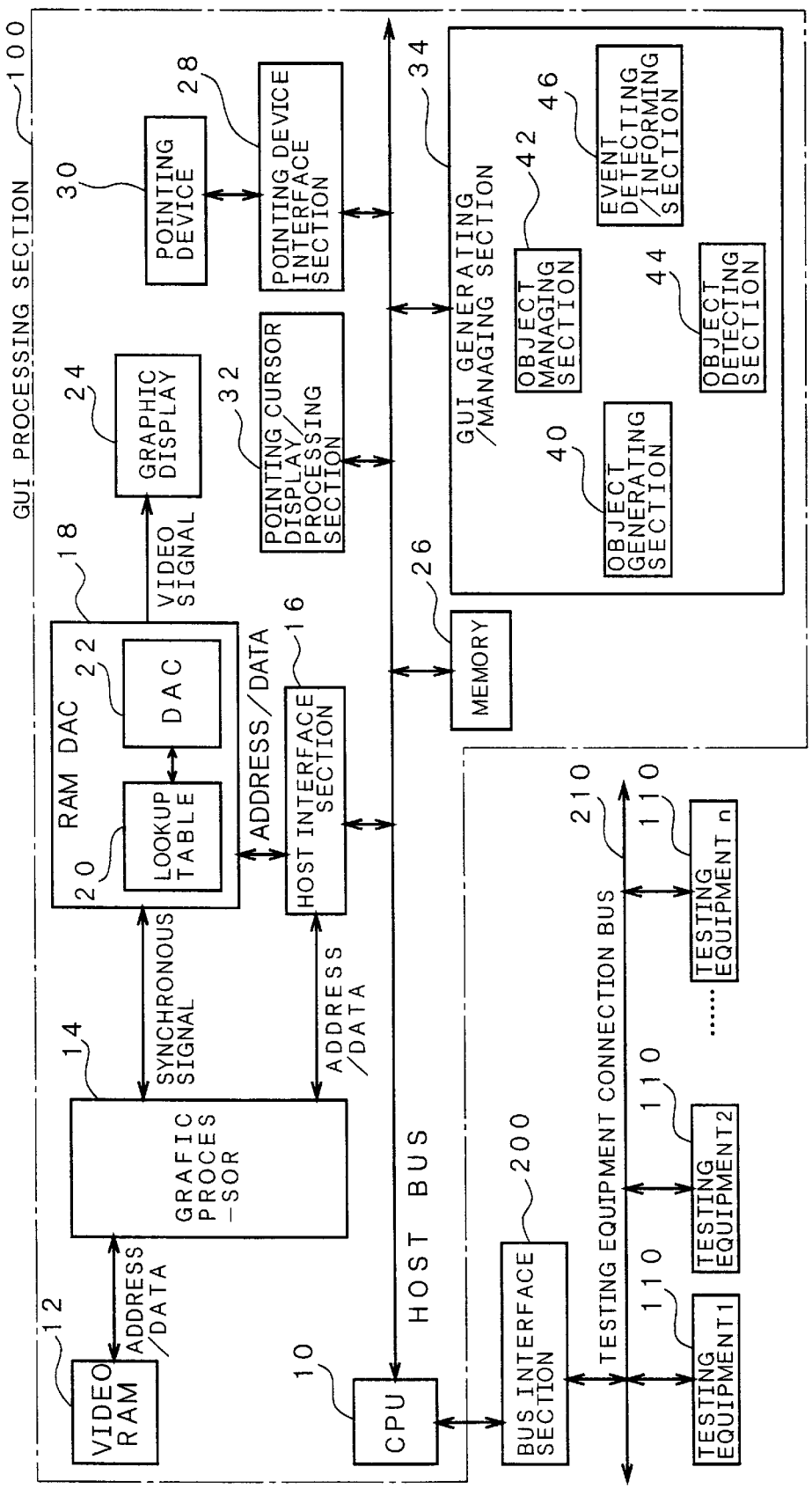
FIG. 12 is a block diagram showing a configuration of testing system according to an embodiment.

FIG. 12 shows an arrangement of a testing system according to an embodiment to which the present invention is applied. The testing system of the embodiment shown in the figure comprises a GUI processing section 100 and a plurality of testing equipment 110. The GUI processing section 100 is for implement GUI environment providing visual feed back for a user, and is implemented by a personal computer, a workstation, or a processing board having functions of them or the like. In addition, the GUI processing section 100 is connected to a bus interface section 200, and to a plurality of testing equipment 110 connected to a testing equipment connection bus 210 through the bus interface section 200. The testing equipment connection bus 210 includes, for example, a computer network such as TCP/IP, a serial or parallel port, an IEEE 488 port, or a combination of them.

The GUI processing section 100 as described above comprises a CPU 10, a video RAM 12, a graphics processor 14, a host interface section 16, a RAM DAC 18, a graphics display 24, a memory, 26, a pointing device interface section 28, a pointing device 30, a pointing cursor display/processing section 32, and a GUI generating/managing section 34.

The CPU 10 is bus connected to the pointing interface section 16, the memory 26, the pointing device interface section 28, the pointing cursor display/processing section 32, and the GUI generating/managing section 34, and controls the entire GUI processing section 100. The video RAM 12 stores image data to be displayed on the graphics display 24 on dot basis. For example, the video RAM 12 is constituted in a packed pixel system, in which one dot on the display screen of the graphics display 24 corresponds to one pixel value with a size of one byte. The packed pixel system usually uses a memory region of the video RAM 12 corresponding to the number of dots on the display screen as a display area, and a remaining memory region (non-display area) for building or storing a GUI part such as a window image or an icon image.

The graphics processor 14 receives a command sent from the CPU 10, and sets the video RAM 12. In addition, the graphics processor 14 generates a synchronous signal necessary for screen display, reads pixel data for the display area of the video RAM 12 in synchronization with the generated synchronous signal, and sends it to the RAM DAC 18. The memory 26 is used for initializing the graphics processor 14 or the like, or for storing font or image data.

The RAM DAC 18 is for converting the pixel data sent from the graphics processor 14 into a video signal. The converted video signal is sent to the graphics display 24. The RAM DAC 18 includes a lookup table 20 and a DAC 22.

In addition, GUI on the display screen of the graphics display 24 is controlled by the pointing device 30. The pointing device 30 has a push button switch, and sends movement information as well as ON/OFF information of the push button switch (for example, a state where the push button is pressed corresponding to ON state, while a state where a finger or the like is released from the push button corresponding to OFF state) to the CPU 10 through the pointing device interface section 28. The pointing cursor display/processing section 32 displays the pointing cursor on a position on the screen of the graphics display 24 pointed by the pointing device 30. Specifically, the pointing cursor display/processing section 32 stores the cursor displayed position and the position of cursor image stored in the non-display area of the video RAM 12, and transfers cursor image stored in the non-display region of the video RAM 12 to the cursor displayed position on the display region of the video RAM 12, thereby displaying the cursor. The pointing cursor displaying/processing section 32 generates a default cursor image on the non-display area of the video RAM 12 at starting the system, and stores the region of the generated cursor image. The cursor displayed position thereafter is captured by detecting movement of the pointing device 30.

In addition, the GUI generating/managing section 34 includes an object generating section 40, an object managing section 42, an object detecting section 44, and an event detecting/informing section 46. The object generating section 40 generates an object, and stores the generated object in the memory 26. The object managing section 42 manages the object on the memory 26 generated by the object generating section 40. The management of object is performed by holding on the memory 26 a table of types and names of objects, and entry points of objects.

The object detecting section 44 has a function for specifying a type and name of an object, thereby detecting an entry point of the object. This function is implemented by referring to a table which the object managing section 42 has. In addition, the object detecting section 44 has a function detecting an object responsible for event processing by the pointing device 30 at any positional coordinates on the screen of the graphics display 24.

The event detecting/informing section 46 detects an event from the pointing device 30, and obtains positional coordinates on the screen where the event occurs. Then, the event detecting/informing section 46 detects an object for managing a displayed image in response to the event input from the pointing device 30 with the object detecting section 44, and performs informing process of the event on the detected object. The event detected by the event detecting/informing section 46 is a one from the pointing device 30, and any one of button-down, button-up, or drag.

Figure 13:
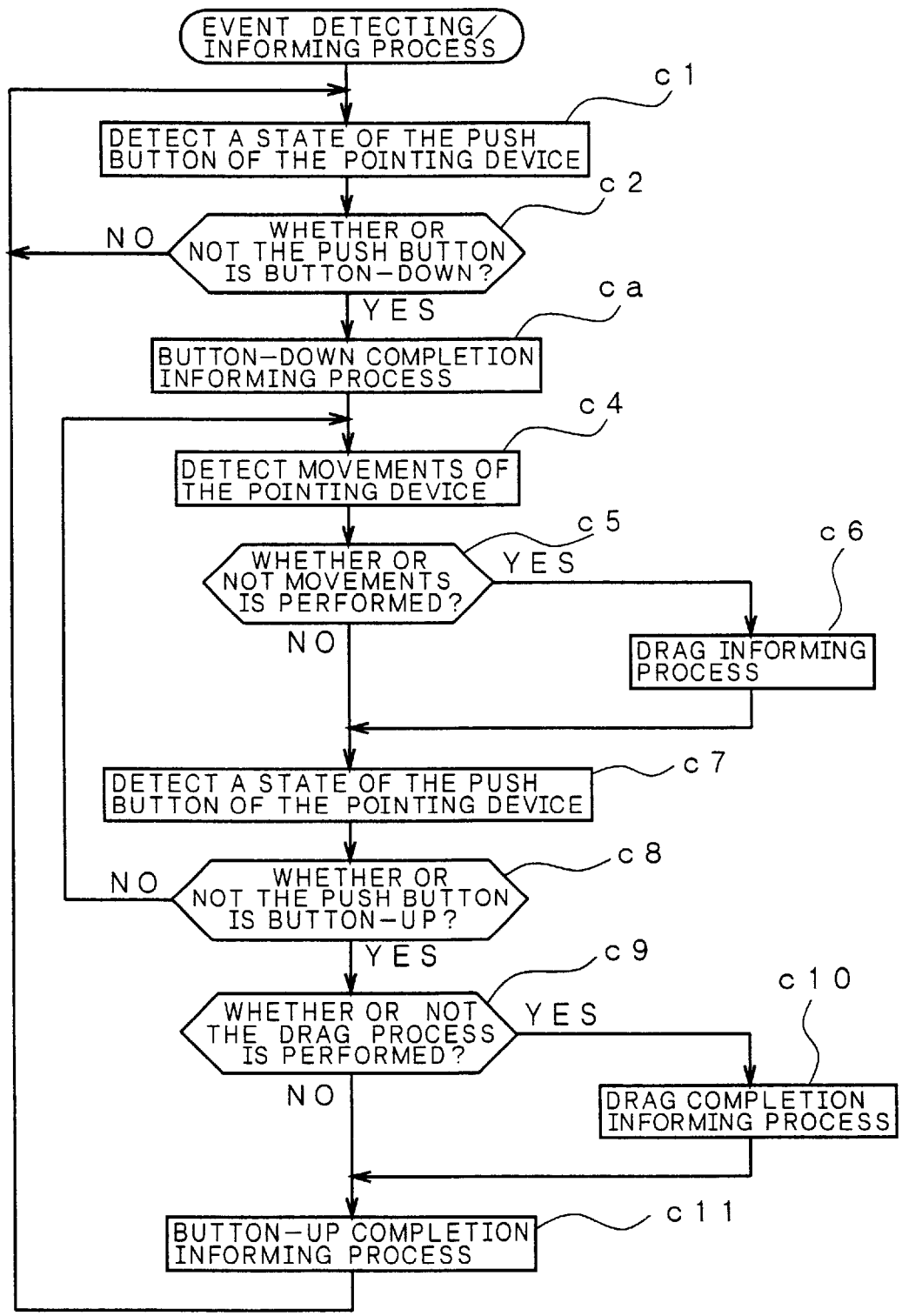
FIG. 13 is a flowchart showing the operation procedure of an event detecting/informing process by an event detecting/informing section.

FIG. 13 is a flowchart showing the operation procedure of an event detecting/informing process by an event detecting/informing section 46. First, the event detecting/informing section 46 detects a state of the push button of the pointing device 30 (step c1), and determines whether or not the push button is pressed down (the state where the push button is pressed down being called "button-down") (step c2). If the push button is not pressed down, the process returns to step c1, and is repeated.

If the push button is pressed down, a 'button-down completion informing process' is performed (step c3). In the 'button-down completion informing process,' the event detecting/informing section 46 detects an object for which the event processing is performed using the object detecting section 44, and executes the 'button-down completion process' on the detected object with the positional coordinates where the event occurred as an argument.

Then, the event detecting/informing section 46 detects movement of the pointing device 30 (step c4), and determines whether or not movement is performed (step c5). If the pointing device 30 is moved, the event detecting/informing section 46 performs a drag informing process' (step c6), and, if it is not moved, detects the state of the push button of the pointing device 30 (step c7).

In the 'drag informing process' in step c6, the event detecting/informing section 46 detects an object on which the event processing is performed using the object detecting section 44, and causes the detected object to execute the "drag process" with the positional coordinates as an argument. After the 'drag process' is executed, the process proceeds to step c7 where the state is detected for the push button of the pointing device 30.

Then, the event detecting/informing section 46 determines whether or not the push button is in a released state where a finger or hand of the user is released from the push button (this state being called "button-up") based on the result of detection on the state of the push button of the pointing device 30 in step c7 (step c8). If it is not in the button-up state, the process returns to step c4 described above, and is repeated. In addition, if it is in the button-up state, the event detecting/informing section 46 determines whether or not the drag process is performed (step c9). Whether or not the drag process" is performed can be determined from whether or not the pointing device 30 is moved in a state where the push button is pressed down. If the pointing device 30 is moved in a state where the push button is pressed down, it is determined that the drag process is performed, and the 'drag completion informing process' is performed (step c10). On the other hand, if the drag process is not performed, then a 'button-up completion informing process' is performed (step c11).

In the "drag completion informing process" in step c10, the event detecting/informing section 46 detects an object on which the event processing is performed using the object detecting section 44, and causes the detected object to execute the "drag completion informing process" with the positional coordinates of the pointing cursor as an argument. In addition, in the 'button-up completion informing process' in step c11, the event detecting/informing section 46 detects an object on which the event processing is performed using the object detecting section 44, and causes the detected object to execute the "button-up completion informing process" with the positional coordinates of the pointing cursor where the "button-up" is occurred as an argument. Then, the process returns step c1 described above for repetition.

Then, each object has a 'table of process corresponding to event' in which processes started by the "button-down process," "drag process," "drag completion process," and "button-up completion process" a redefined. Then, when each process is executed, the previously set 'table of process corresponding to event' is referenced to execute a process corresponding to an occurred event.

Now, the outline of the object generating section 40 is described based on each embodiment.

Embodiment 1

Embodiment 1 is a case using an object generating section 40 which as functions of test parameter storage means, test data storage means, virtual instrument means, virtual instrument service means, representation sheet means, test class means, slot information means, interactor means, and test plan means. In the following, detail is described on a parent object, associating relationship, attribute and process of an object which is utilized by each of test parameter storage means, test data storage means, virtual instrument means, virtual instrument service means, representation sheet means, test class means, slot information means, interactor means, and test plan means.

"Test item":
[Parent object]: None
[Association relationship]:
"Test file name"
It associates a plurality of "test condition file names" which the "test item" can utilize.
[Attribute]:
Name
It is a region for storing a string representing a name of test item on the memory 26.
Display Image
It is a region for storing a display image of an icon of "test item" on the memory 26.
[Process]:
Generate Icon (positional coordinates, display region)
It references the 'display image' attribute to display the icon of "test item" at the positional coordinates provided by an argument on the display region provided by an argument.
Display Icon of Available Test Condition File Name (display region)
It generates an icon of "test condition file name" on a display region provided by an argument by utilizing the 'generate icon' process of the "test condition file name" which it associates.

"Test condition file name":
[Parent object]: None
[Association relationship]: None
[Attribute]:
Name
It is a region for storing the name of test condition file name stored in the memory 26 on the memory 26.
Display Image
It is a region for storing a display image of an icon of "test condition file name" on the memory 26.
[Process]:
Generate Icon (positional coordinates, display region)
It references the display: 'image' attribute to display the icon of "test condition file name" at the positional coordinates provided by an argument on the display region provided by an argument.

"Test tradeoff":
[Parent object]: None
[Association relationship]: None
[Attribute]:
Tradeoff information
It is a region for storing test tradeoff information whether the test is conducted at a high speed or high accuracy on the memory as a string.

Positional Coordinates of Icon of "Test Element Name" Corresponding to High Speed Test
It is a region for storing the positional coordinates of an icon of "test element name" corresponding to a high speed test on the memory 26.
Positional Coordinates of Icon of "Test Element Name" Corresponding to High Accuracy Test
It is a region for storing the positional coordinates of an icon of "test element name" corresponding to a high accuracy test on the memory 26.
[Process]:
Display Icon (display region on graphical display, entry point of "test element name")
It generates icons of "test element name" corresponding to a high speed test and a high accuracy test on the display region provided by an argument on the graphical display. The image of icon to be generated references the 'display image' attribute of the "test element name" provided by an argument. The positional coordinates of generated icons of "test element name" corresponding to the high speed test and the high accuracy test on the display region provided by the argument on the graphical display are stored in the 'positional coordinates of icon of "test element name" corresponding to high speed test' and 'positional coordinates of icon of "test element name" corresponding to high accuracy test' attributes, respectively.
Set Tradeoff (positional coordinates)
It references the 'positional coordinates of icon of "test element name" corresponding to high speed test' and 'positional coordinates of icon of "test element name" corresponding to high accuracy test' attributes. Then, when the icon at the positional coordinates provided by the argument is the icon of "test element name" corresponding to the high speed test, it stores the string of "high speed measurement" in the 'tradeoff information' attribute. When the icon at the positional coordinates provided by the argument is the icon of "test element name" corresponding to the high accuracy test, it stores the string of "high accuracy test" in the 'tradeoff information' attribute.

"Test goal":
[Parent object]: None
[Association relationship]:
Test Item
It associates one test item.
Test Condition File Name
It associates one test condition file name. It associates one "test tradeoff."
[Attribute]: None
[Process]:
Set Test Item (entry point of "test item")
It sets an entry point of "test item" provided by an argument in the association relationship.
Set Test Condition File Name (entry point of "test condition file name")
It sets an entry point of "test condition file name" provided by an argument in the association relationship.
Set Test Tradeoff (entry point of "test tradeoff")
It sets an entry point of "test tradeoff" provided by an argument in the association relationship.

"Test element name":
[Parent object]: None
[Association relationship]:
"Test Item"
It associates a plurality of "test items" which can be utilized in a test element.

[Attribute]:
Name
It is a region for storing a string representing a test element name on the memory 26.
Display Image
It is a region for storing a display image of an icon of "test element name" on the memory 26.
Test Item Started by Default
It is a region for storing an entry point of "test item" started by default.
[Process]:
Generate Icon (positional coordinates, display region)
It references the 'display image' attribute to display the icon of "test element name" at the positional coordinates provided by an argument on the display region provided by an argument.
Display Icon of Available Test Item (display region)
It generates an icon of "test item" on a display region provided by an argument by utilizing the 'generate icon' process of the "test item" which it associates.
"Test task":
[Parent object]: Task component
[Association relationship]:
"Test goal"
It associates a plurality of "test goals."
"Test Element Name"
It associates one "test element name."
[Attribute]:
Name
It is a region for storing a string representing a test task on the memory 26.
Display Image of Test Task
It is a region for storing a display image of an icon of a test task on the memory 26.
DUT Display Image
It is a region for storing a display image of icon of a DUT on the memory 26.
Base Canvas of Test Task
It is a region for storing a display region on the graphical display which the test task utilizes on the memory 26.
Canvas of Test Task
It is a region for storing a display region on the base canvas of test task which the test task utilizes on the memory 26.
Test Item Canvas
It is a region for storing a display region on the test task canvas for displaying an available test item on the memory 26.
Test Condition Canvas
It is a region for storing a display region on the test task canvas for displaying an available test condition file name on the memory 26.
Workspace
It is a region for storing on the memory 26 a display region on the test task canvas for a DUT icon, icons of "test element names" corresponding to the high speed test and the high accuracy test, an icon of selected "test item", and an icon of selected "test condition file name."
Test Element Display Canvas
It is a region for storing a display region on the base canvas of test task for displaying an available test item on the memory 26.
[Process]:
Initialize test task ( )
The 'initialize test task' process performs the following processes:

(1) Execute the 'generate display region' process;
(2) Detect an "interactor" with the object detecting means, and display on a display region provided by an argument an icon of "test element name" corresponding to a "virtual instrument" which the "interactor" associates;
(3) Execute the 'generate icon' process by specifying a display region which is stored in the 'test element display canvas' attribute; and
(4) Execute the 'generate DUT icon' process by specifying a display region which is stored in the 'workspace' attribute, and display coordinates.

Generate Display Region ( )
It generates display regions corresponding to the 'base canvas of test task,' 'test task canvas,' 'test item canvas,' 'workspace,' and 'test element canvas' attributes on the graphical display, and stores them in each attribute.
Generate Icon (positional coordinates, display region)
It references the 'display image of test task' attribute to display the icon of "test task" at the positional coordinates provided by an argument on the display region provided by an argument.
Generate DUT icon (positional coordinates, display region)
It references the 'DUT display image' attribute to display the icon DUT at the positional coordinates provided by an argument on the display region provided by an argument.
Select Test Element Name (entry point of "test element name)
The 'select test element name' process is a process executed when an icon of "test element name" icon is dropped on a region indicated by the 'workspace' attribute. The 'select test element name' process first sets an entry point of 'test element name' provided by an argument in the association relationship. Then, it generates the "test tradeoff," and executes the 'set test tradeoff' process of the "test goal" by specifying an entry point of the generated "test tradeoff." Then, it executes the 'display icon' process of the generated "test tradeoff" with the display region stored in the 'workspace' attribute as an argument. Finally, it executes the 'display icon of available test item' process of the "test element name" provided by an argument, with the display region stored in the 'test condition canvas' attribute as an argument.
Select Test Item (entry point of "test item")
The 'select test item' process is a process executed when an icon of "test item" icon is dropped on a region indicated by the 'workspace' attribute. The 'select test item' process first executes the 'set test item' process of "test goal" which the "test task" associates by specifying an entry point of the "test item" provided by an argument. Then, it deletes an icon of selected "measurement item" on the test item canvas. Then, it executes the 'generate icon' process of the "test item" provided by an argument by specifying a display region which stored in the 'workspace' attribute, and positional coordinates. Finally, it displays the icon of 'available test condition file name' of "test item" provided by an argument by specifying a display region which is stored in the 'test condition canvas' attribute.
Select Test Condition File Name (entry point of "test condition file name")
The 'select test condition file name' process is a process executed when an icon of "test condition file name" is dropped on a region indicated by the 'workspace' attribute.
The 'select test condition file name' process first executes the 'set test condition file name' process of "test goal" which the "test task" associates by specifying an entry point of the "test condition file name" provided by an argument. Then, it deletes an icon of selected "test condition file name" on the test condition canvas. Finally, it executes the 'generate icon' process of the "test condition file name" provided by an argument by specifying a display region which stored in the 'workspace' attribute, and positional coordinates.

Drop Process of DUT Icon (positional coordinates)

The 'drop process of DUT icon' process is a process executed when an icon of DUT is dropped on a region indicated by the 'workspace' attribute. The 'drop process of DUT icon' executes the following processes only when there are icons of "test element name" corresponding to the high speed test and the high accuracy test at positional coordinates provided by an argument. First, it detects the "test tradeoff" which the "test goal" associates from the "test goal" which the "test task" associates, and executes 'set tradeoff' process of the "test tradeoff" by specifying positional coordinates provided by an argument. Then, it executes the 'set tradeoff' process of the 'connect DUT icon and test element name icon' by specifying positional coordinates provided by an argument. Finally, it starts execute process.

Connect DUT Icon and Test Element Name Icon (positional coordinates)

It connects and displays either one of the icons of "test element name" corresponding to the high speed test or the icon of "test element name" corresponding to the high accuracy test at the positional coordinates specified by an argument, and the DUT icon.

Execute (entry point of string of test result corresponding to test item)

The 'execute process' first detects a "virtual instrument" corresponding to a "test element name." Then, it executes the 'start test' process of the detected "virtual instrument" by specifying the "test goal" which it associates, and an entry point of string of the test result corresponding to the test item provided by an argument.

"Test parameter item":
 [Parent object]: None
 [Association relationship]: None
 [Attribute]:
 Test Parameter Item Name:
  It is a region for storing a string representing a name of test parameter item on the memory 26.
 Parameter
  It is a region for storing a parameter of test parameter item on the memory 26.
 [Process]: None "Test parameter":
 [Parent object]: None
 [Association relationship]:
 "Test parameter item"
  It associates a plurality of "test parameter items" necessary for the "virtual instrument" to conduct the test once.
 "Test Data"
  It associates one "test data" for storing data obtained utilizing the "test parameter."
 [Attribute]: None
 [Process]:
 Attach (entry point of "test parameter item")
  It is a process for setting the "test parameter item" provided by an argument in the association relationship.

"Test data":
 [Parent object]: None
 [Association relationship]:
 "Test Parameter"
  It associates one "test parameter" utilized in acquiring test data.

[Attribute]:
 X-axis Data
  It is a region for storing array data of, for example, floating point type obtained from the test element on the memory 26.
 Y-axis Data
  It is a region for storing array data of, for example, floating point type obtained from the test element on the memory 26.
 [Process]:
 Acquire X-axis Data (array position)
  It is a process for reading data of 'X-axis data' attribute at an array position provided by an argument.
 Acquire Y-axis Data (array position)
  It is a process for reading data of 'Y-axis data' attribute at an array position provided by an argument.

"Virtual Instrument":
 [Parent object]: "Virtual instrument":
 [Association relationship]:
 "Test Data"
  It associates a plurality of "test data" obtained as a result of test.
 "Test Parameter"
  It associates a plurality of "test parameters" utilized for the test.
 "Representation Sheet"
  It associates a plurality of "representation sheets" for displaying the test data on the graphics display.
 [Attribute]: None
 [Process]:
 Start Measurement (entry point of "test goal," entry point of string of test result corresponding to test item)
  The 'start measurement' process performs the following processes:
  (1) Generate a "test parameter," and specify the generated "test parameter item" in the entry point of the "test parameter item" to execute the 'attach' process of the generated "test parameter."
  (2) Generate all "test parameter items" which the "virtual instrument" requires for one test, and specify the generated "test parameter item" in the entry point of the "test parameter item" to execute the 'attach' process of the generated "test parameter."
  (3) Generate a "test class" corresponding to the "test item" which the "test goal" provided by an argument associates.
  (4) Specify an entry point of the "virtual instrument" to execute 'initialize' of the generated "test class."
  (5) When the "test goal" provided by an argument associates a "test condition file name," specify an entry point of the "test condition file name" which the "test goal" associates, and execute the set test condition process of the generated "test class."
  (6) Specify entry points of the generated "test parameter" and the "virtual instrument," and execute the 'generate test parameter' process of the generated "test class."
  (7) Specify an entry point of the generated "test condition parameter," and execute the 'generate test data' process to generate "test data."
  (8) Specify an entry point of the generated "test data," and execute the 'generate representation sheet' process to generate a "representation sheet."
  (9) Specify an entry point of the generated "test parameter," and execute 'execute test' process.
  (10) Specify a set of entry points of the generated "test data" and an entry point of a string of test result corresponding to the test item, and execute the 'obtain test result corresponding to test item' process of the generated "test class."

Generate Test Parameter with Test Item and Slot Information (entry point of "test item," entry point of entry information of "slot information")

The 'generate test parameter' process performs the following processes:
(1) Generate "test parameter," and set it in the association relationship of "virtual instrument."
(2) Generate all "test parameter items" which the "virtual instrument" requires for one test, and specify the generated "test parameter item" in the entry point of the "test parameter item" to execute the 'attach' process of the generated "test parameter."
(3) Generate a "test class" corresponding to the "test item" provided by an argument.
(4) Specify an entry point of the "virtual instrument" to execute 'initialize' of the generated "test class."
(5) Specify an entry point of the "slot information" provided by an argument, and execute the 'set slot information' process of the generated "test class."
(6) Specify entry points of the generated "test parameter" and the "virtual instrument," and execute the 'generate test parameter' process of the generated "test class."
(7) Specify an entry point of the generated "test parameter," and execute the 'generate test data' process to generate "test data."
(8) Specify an entry point of the generated "test data," and execute the 'generate representation sheet' process to generate a "representation sheet."

Generate Test Data (entry point of "test parameter")

The 'generate test data' process first generates "test data." Then, it set the generated "test data" in the association relationship of "virtual instrument." Then, it sets the "test parameter" provided by an argument in the association relationship of the generated "test data." Finally, it sets the generated "test data" in the association relationship of the "test parameter" provided by an argument.

Generate Representation Sheet (entry point of "test data")

The 'generate representation sheet' process generates a "representation sheet," and sets the "test data" provided by an argument, in the association relationship of the generated "representation sheet."

Execute Test (entry point of "test parameter")

The 'execute test' process sets the "test parameter item" which the "test parameter" provided by an argument associates in the test element, performs measurement by controlling the test element, and obtain test data from the test element. The obtained test data is stored in the regions on the memory of the "X-axis data" and "Y-axis data" attributes of the "test data" which the "test parameter" provided by an argument associates. Then, it detects a "representation sheet" which associates the "test data," and implements the update process of the detected "representation sheet."

Set Test Parameter Item (data, test parameter item name, entry point of "test parameter")

The 'set test parameter item' process first detects a "test parameter item" of which the test parameter item name provided by an argument is the 'name' attribute of "test parameter item" from the "test parameter item" which the "test parameter" provided by an argument associates. Then, it sets data provided by an argument in the 'parameter' attribute of the detected "test parameter item."

"Virtual Instrument Service":
[Parent object]: None
[Association relationship]: None
[Attribute]:
Display Image
It is a region for storing a display image of icon of "virtual instrument service" on the memory.

[Process]:
Execute Service (entry point of "slot information")
It is a process prepared such that the 'execute service' process for a child object can be executed even when the child object such as "peak search" is treated as a "virtual instrument service,"
Generate Icon (positional coordinates, display region)
It references the 'display image' attribute to display the icon of "virtual instrument service" at the positional coordinates provided by an argument on the display region provided by an argument.

"Peak search":
[Parent object]:
"Virtual Instrument Service"
[Association relationship]: None
[Attribute]: None
[Process]:
Execute Service (entry point of "slot information")
The 'execute service' process first acquires array data of X- and Y-axes in a specified range provided by the "slot information" from the "test data" which is associated by the "slot information" provided by an argument. Then, it detects an array number with a peak value form the acquired Y-axis array data. Then, it represents data of X- and Y-axes of the array number having the peak value on the graph representation. Finally, it displays an icon representing the peak at a position on the graph representation corresponding to the array number with the peak value.

"Representation Sheet":
[Parent object]:None
[Association relationship]:
"Virtual Instrument"
It associates one "virtual instrument" which generates the "representation sheet."
"Test data"
It associates one "test data" which has test data to be graph represented.
"Slot information"
It associates a plurality of "slot information" from which the "representation sheet" is generated.
[Attribute]:None
[Process]:
Display Test Result ( )
The 'display test result' process performs the following processes:
(1) Generate a region on the graphics display for displaying the test result.
(2)
Display a graph by referencing the "test data" which it associates.
Update ( )
The 'update' process deletes a graph being displayed, and display a graph again by referencing the "test data" which it associates.
Highlight (minimum value on X-axis, maximum value on X-axis, minimum value on Y-axis, maximum value on Y-axis)
The 'highlight' process is a process executed from the event detecting/informing section 46 when a range is specified through an operation of the pointing device 30 on the graph representation created by the "representation sheet." The 'highlight' process performs the following processes:
(1) Specify the minimum value on X-axis provided by argument, the maximum value on X-axis, the minimum value on Y-axis, and the maximum value on Y-axis provided by argument, and execute the 'generate slot information' process to generate the "slot information."

(2) Execute the 'update' process of the generated "slot information."
(3) Execute the 'display available virtual instrument service' process.
(4) Execute the 'display available test element name' process.

Generate Slot Information (minimum value on X-axis, maximum value on X-axis, minimum value on Y-axis, maximum value on Y-axis)

Detail of the 'generate slot information" is shown in the following:

(1) Generate the "slot information," and set an entry point of the "representation sheet" itself in the 'representation sheet' attribute of the "slot information."
(2) Execute the 'acquire X-axis data corresponding to positional coordinate on X-axis' process by specifying the minimum value on X-axis provided by an argument, and acquire X-axis data corresponding to the minimum value on X-axis.
(3) Execute the 'acquire X-axis data corresponding to positional coordinate on X-axis' process by specifying the maximum value on X-axis provided by an argument, and acquire X-axis data corresponding to the maximum value on X-axis.
(4) Execute the 'acquire Y-axis data corresponding to positional coordinate on Y-axis' process by specifying the minimum value on Y-axis provided by an argument, and acquire Y-axis data corresponding to the minimum value on Y-axis.
(5) Execute the 'acquire Y-axis data corresponding to positional coordinate on Y-axis' process by specifying the maximum value on Y-axis provided by an argument, and acquire Y-axis data corresponding to the maximum value on Y-axis.
(6) Specify the X-axis data corresponding to the minimum value on X-axis, the X-axis data corresponding to the maximum value on X-axis, the Y-axis data corresponding to the minimum value on Y-axis, and the Y-axis data corresponding to the maximum value on Y-axis to executed the 'initialize' process of the generated "slot information."

Display Available Virtual Instrument Service (display region)

The 'display available virtual instrument service' process references the "virtual instrument" which it associates to display an icon of "virtual instrument service" which the "virtual instrument" associates on a display region provided by an argument.

Display Available Test Element Name (display region)

The 'display available test element name' process detects an "interactor" with the object detecting means, and displays an icon of the "test element name" corresponding to the "virtual instrument" which the "interactor" associate on a display region provided by an argument.

Acquire X-axis Data Corresponding to Positional Coordinate on X-axis (positional coordinate)

The 'acquire X-axis data corresponding to positional coordinate on X-axis' process is a process which references the "test data" which it associates, and acquires X-axis data corresponding to a positional coordinate provided by an argument.

Acquire Y-axis Data Corresponding to Positional Coordinate on Y-axis (positional coordinate)

The 'acquire Y-axis data corresponding to positional coordinate on Y-axis' process is a process which references the "test data" which it associates, and acquires Y-axis data corresponding to a positional coordinate provided by an argument.

"Test Class":
  [Parent object]: None
  [Association relationship]: None
  [Attribute]: None
  [Process]:
Initialize (entry point of "virtual instrument")
  The 'initialize' process of the "test class" does nothing. It is a process prepared such that it can execute the 'initialize' process for a child object when the child object is treated as the "test class."
Set Test Condition (entry point of "test condition file name")
  The "set test condition' process of the "test class" does nothing. It is a process prepared such that it can execute the 'set test condition' process for a child object when the child object is treated as the "test class."
Set slot Information (entry point of "slot information")
  The "set slot information" process of the "test class" does nothing. It is a process prepared such that it can execute the 'set slot information' process for a child object when the child object is treated as the "test class."
Generate Test Parameter (entry point of "test parameter")
  The "generate test parameter' process of the "test class" does nothing. It is a process prepared such that it can execute the 'generate test parameter' process for a child object when the child object is. treated as the "test class."
Acquire Test Result Corresponding to Test Item (entry point set of "test data," entry point of string of test result corresponding to test item)
  The "acquire test result corresponding to test item' process of the "test class" does nothing. It is a process prepared such that it can execute the 'generate test parameter' process for a child object when the child object is treated as the "test class."

"Leaf Test Class":
  [Parent object]: Test class
  [Association relationship]:
"Implementer of Test Class":
  It associates one "implementer of test class" which converts an abstract test parameter generated by the "leaf test class" into a specific test parameter for each "virtual instrument."
  [Attribute]: None
  [Process]:
"Generate Test Parameter" (entry point of "test parameter")
  It specifies an entry point of the "test parameter" provided by an argument, and executes the 'generate test parameter' process of the "implementer of test class" which it associates.

"Power Spectrum Measurement":
  [Parent object]: Leaf test class
  [Association relationship]: None
  [Attribute]:
Central Frequency
  It is a region for storing the central frequency for measurement of power spectrum on the memory 26.
Frequency Span
  It is a region for storing a frequency span for measurement of power spectrum on the memory 26.
  [Process]:
Initialize (entry point of "virtual instrument")
  The 'initialize' process generates an "implementer of test class" corresponding to the "virtual instrument" provided by an argument and the "power spectrum," and sets it in the association relationship of the "leaf test class." Then, it specifies the entry points of the "virtual instrument" provided by an argument and the "power spectrum measurement" itself to execute the 'initialize' process of the "implementer of test class."

Set Test Condition (entry point of "test condition file name")

The 'set test condition' process reads a test condition file on the memory the name of which matches the 'name' attribute the "test condition file name" provided by an argument. Then, it sets the content being read in the 'central frequency' and 'frequency span' attributes.

Set Slot Information (entry point of "slot information")

The 'set slot information' process references the "slot information" provided by an argument to set the content of the 'central frequency' and 'frequency span' attributes. It references the 'X-axis data corresponding to the minimum value on X-axis' and 'X-axis data corresponding to the maximum value on X-axis' attributes of the "slot information" provided by an argument, and sets in the 'central frequency' attribute the central frequencies of 'X-axis data corresponding to the minimum value on X-axis' and 'X-axis data corresponding to the maximum value on X-axis.' It references the 'X-axis data corresponding to the minimum value on X-axis' and 'X-axis data corresponding to the maximum value on X-axis' attributes of the "slot information" provided by an argument, and sets in the 'frequency span' attribute a frequency of difference between the frequencies of 'X-axis data corresponding to the minimum value on X-axis' and 'X-axis data corresponding to the maximum value on X-axis.

"Line Spectrum Measurement":
 [Parent object]: Leaf test class
 [Association relationship]: None
 [Attribute]:
Measurement Frequency
 It is a region for storing the measurement frequency for measurement of line spectrum on the memory 26.
 [Process]:
Initialize (entry point of "virtual instrument")
 The 'initialize' process generates an "implementer of test class" corresponding to the "virtual instrument" and the "line spectrum," provided by an argument and sets it in the association relationship of the "leaf test class." Then, it specifies the entry points of the "virtual instrument" itself and the "line spectrum measurement" itself provided by an argument to execute the 'initialize' process of the "implementer of test class."

Set Test Condition (entry point of "test condition file name")
 The 'set test condition' process reads a test condition file on the memory 26 the name of which matches the 'name' attribute the "test condition file name" provided by an argument. Then, it sets the content being read in the 'measurement frequency' attribute.

Set Slot Information (entry point of "slot information")
 The 'set slot information' process references the "slot information" provided by an argument to set the content of the 'measurement frequency.' It references the 'X-axis data corresponding to the minimum value on X-axis' and 'X-axis data corresponding to the maximum value on X-axis' attributes of the "slot information" provided by an argument, and sets in the 'measurement frequency' attribute the central frequencies of 'X-axis data corresponding to the minimum value on X-axis' and 'X-axis data corresponding to the maximum value on X-axis.

"Composite Test Class":
 [Parent object]: Test class
 [Association relationship]:
"Measurement Class" for High Speed Measurement
 It associates one "measurement class" for the high speed measurement.
"Measurement Class" for High Accuracy Measurement
 It associates a plurality of "measurement classes" for the high accuracy measurement.

[Attribute]: None
 [Process]: None
"High Harmonics Measurement":
 [Parent object]: Composite test class
 [Association relationship]: None
 [Attribute]:
Fundamental Harmonic Frequency
 It is a region for storing the fundamental harmonic frequency on the memory 26.
Order of Measurement
 It is a region for storing the order of the highest high harmonics to be measured on the memory 26.
 [Process]:
Initialize (entry point of "virtual instrument")
 The 'initialize' process performs the following processes:
 (1) Generate one "power spectrum measurement" for the high speed measurement, and sets it in the "measurement class" for the high speed measurement of the included "composite test class."
 (2) Set the 'central frequency' and 'frequency span' attributes of the generated "power spectrum measurement."The 'central frequency' is a frequency intermediate between the fundamental harmonic and the maximum order high harmonics. The 'frequency span' is a frequency equal to or higher than the difference between the fundamental harmonic and the highest order high harmonics.
 (3) Specify an entry point of the "virtual instrument" provided by an argument to execute the 'initialize' process of the generated "power spectrum measurement."
 (4) Generate the "line spectrum measurement" for the high accuracy measurement for the number of orders of the fundamental harmonic and the high harmonics to be measured, and set them in the "measurement class" for high accuracy of the included "composite test class."
 (5) Set frequencies of the fundamental harmonic and high harmonics to be measured in each "measurement frequency" attribute of the generated "line spectrum measurement."
 (6) Specify an entry point of the "virtual instrument" provided by an argument to execute the 'initialize' process of all the generated "line spectrum measurement."

Set Test Condition (entry point of "test condition file name")
 The 'set test condition' process reads a test condition file on the memory 26 the name of which matches the 'name' attribute the "test condition file name" provided by an argument. Then, it sets the content being read in the 'fundamental harmonic frequency' and 'order of measurement' attributes.

Acquire Test Result Corresponding to Test Item (entry point set of "test data," entry point of string of test result corresponding to test item)
 The 'acquire test result corresponding to test item' process references the set of entry points of "test data" provided by an argument to calculate a power ratio between the fundamental harmonic and the high harmonics. Then, it converts the calculated result into a string, and sets it in the region pointed by the entry point of string of the test result corresponding to the test item provided by an argument.

"Implementer of Test Class":
 [Parent object]: None
 [Association relationship]: None
 [Attribute]:
Virtual Instrument
 It is a region for storing an entry point of the "virtual instrument" for which the test parameter is generated.
"Leaf Test Class"
 It is a region for storing an entry point of the "leaf test class" which generates the "implementer of test class."

[Process]:
Initialize (entry point of "virtual instrument," entry point of "leaf test class")
  The 'initialize' process stores the "virtual instrument" provided by an argument in the 'virtual instrument' attribute. In addition, it stores the "leaf test class" provided by an argument in the 'leaf test class' attribute.
Generate Test Parameter (entry point of "test parameter")
  The "generate test parameter' process of the "implementer of test class" does nothing. It is a process prepared such that it can, execute the 'generate test parameter' process for a child object when the child object is treated as the "implementer of test class."
"Implementer for power spectrum measurement for virtual spectrum analyzer":
  [Parent object]: Implementer of test class
  [Association relationship]: None
  [Attribute]: None
  [Process]:
Generate Test Parameter (entry point of "test parameter")
  The 'generate test parameter' process performs the following processes:
  (1) Reference the 'virtual instrument' attribute of the included "implementer of test class," and obtain an entry point of the "virtual instrument."
  (2) Read the 'central frequency' attribute of the "power spectrum measurement" which is stored as the 'leaf test class attribute of the included "implementer of test class."
  (3) Specify the entry point of the "test parameter" provided by an argument, the value of 'central frequency' attribute, and the name of central frequency, and execute the 'set the test parameter item' process of the obtained "virtual instrument."
  (4) Read the 'frequency span' attribute of the "power spectrum measurement" which is stored as the 'leaf test class' attribute of the included "implementer of test class."
  (5) Specify the entry point of the "test parameter" provided by an argument, the value of 'frequency span' attribute, and the name of frequency span, and execute the 'set the test parameter item' process of the obtained "virtual instrument."
"Implementer for line spectrum measurement for virtual spectrum analyzer":
  [Parent object]: Implementer of test class
  [Association relationship]: None
  [Attribute]: None
  [Process]:
Generate Test Parameter (entry point of "test parameter")
  The 'generate test parameter' process performs the following processes:
  (1) Reference the 'virtual instrument' attribute of the included "implementer of test class," and obtain an entry point of the "virtual instrument."
  (2) Read the 'measurement frequency' attribute of the "line spectrum measurement" which is stored as the leaf test class' attribute of the included "implementer of test class."
  (3) Specify the entry point of the "test parameter" provided by an argument, the value of 'measurement frequency' attribute, and the name of central frequency, and execute the 'set the test parameter item' process of the obtained "virtual instrument."
"Slot Information":
  [Parent object]: None
  [Association relationship]:
Test Data
  The "slot information" associates the "test data" which is the base of generated graph representation.
[Attribute]:
X-axis Data Corresponding to the Minimum Value on X-axis
  It is a region for storing the X-axis data corresponding to the minimum value on X-axis.
X-axis Data Corresponding to the Maximum Value on X-axis
  It is a region for storing the X-axis data corresponding to the maximum value on X-axis.
Y-axis Data Corresponding to the Minimum Value on Y-axis
  It is a region for storing the Y-axis data corresponding to the minimum value on Y-axis.
Y-axis Data Corresponding to the Maximum Value on Y-axis
  It is a region for storing the Y-axis data corresponding to the maximum value on Y-axis.
Specified Virtual Instrument Service
  It is a region for storing array data of entry points of "virtual instrument service."
Specified Virtual Instrument
  It is a region for storing array data of entry points of "virtual instrument."
Representation Sheet
  It is a region for associating the entry point of the "representation sheet" generated by the "slot information."
  [Process]:
Initialize (X-axis data Corresponding to the Minimum Value on X-axis, X-axis Data Corresponding to the Maximum Value on X-axis, Y-axis Data Corresponding to the Minimum Value on Y-axis, Y-axis Data Corresponding to the Maximum Value on Y-axis)
  It stores X-axis data corresponding to the minimum value on X-axis, X-axis data corresponding to the maximum value on X-axis, Y-axis data corresponding to the minimum value on Y-axis, and Y-axis data corresponding to the maximum value on Y-axis provided by an argument in the 'X-axis data corresponding to the minimum value on X-axis,' 'X-axis data corresponding to the maximum value on X-axis,' 'Y-axis data corresponding to the minimum value on Y-axis,' and 'Y-axis data corresponding to the maximum value on Y-axis' attributes.
Update
  It displays the outer frames of ranges indicated by values of the 'X-axis data corresponding to the minimum value on X-axis,' 'X-axis data corresponding to the maximum value on X-axis,' 'Y-axis data corresponding to the minimum value on Y-axis,' and Y-axis data corresponding to the maximum value on Y-axis' attributes on the graph representation of "representation sheet" indicated by the 'representation sheet' attribute.
Specify Test Element Name (entry point of "test element name)
  The 'specify test element name' process first displays the icon of the "test element name" provided by an argument on the graph representation. Then, it searches an "interactor," specifies the entry points of the "test element name" provided by an argument and the "slot information" itself, and executes the 'start new test' process of the "interactor."
Specify Virtual Instrument Service (entry point of "virtual instrument service")
  The 'specify virtual instrument service' process specifies the entry point of the "slot information" itself to execute the 'execute service' process of the "virtual instrument service" provided by an argument. "Interactor"
  [Parent object]: None
  [Association relationship]:
"Virtual Instrument"
  It associates a plurality of "virtual instruments" which can be utilized by the testing system.

[Attribute]: None
[Process]:
Start New Test (entry point of "test element name," entry point of "slot information")

The 'start new test' process references the 'test item started by default' of the "test element name" provided by an argument, and performs the following processes:

(a) If a test item started by default is stored,

It specifies the entry points of the "test item" started by default, the "test element name" provided by an argument, and the "slot information" to execute the 'execute measurement' process.

(b) If a test item started by default is not stored, (1) It specifies a graph representation region, display the icon of the "test item" which the "test element name" provided by an argument associates on the graph representation, and waits until the icon is selected by pointing with the pointing device 30 (pressing the push button of the pointing device 30, and releasing the push button of the pointing device 30 without moving the pointing device).

(2) Once the icon of "test item" is selected, it specifies the entry points of the "test item" corresponding to the selected icon, the "test element name" provided by an argument, and the "slot information," and execute 'execute measurement' process.

Execute Measurement (entry point of "test item," entry point of "slot information." entry point of "test element name")

The 'execute measurement' process performs the following processes:

(1) Detect a "virtual instrument" corresponding to the "test element name" provided by an argument.

(2) Specify the entry points of the "test item" provided by an argument and the "slot information" to execute the 'generate test parameter with test item and slot information' process of the detected "virtual instrument."

(3) Specify an entry point of the generated "test parameter," and execute 'execute test' process of the detected "virtual instrument."

"Task Component":
[Parent object]: None
[Attribute]:
Name

It is a region for storing a string representing a name on the memory 26.
Display Image It is a region for storing a display image of an icon on the memory 26.
Size of Icon in X-axis Direction It is a region for storing the size of icon being displayed on the X-axis direction.
Size of Icon in Y-axis Direction It is a region for storing the size of icon being displayed on the Y-axis direction.
[Process]:
Execute (entry point of string of test result corresponding to test item)

The 'execute' process of "task component" does nothing. It is a process prepared such that the 'execute' process for a child object can be executed even when the child object is treated as a "task component."
Attach (entry point of "task component," coordinate position)

The 'attach process' is a process which is executed when the icon of program element is dropped on the icon of "task component." The 'attach' process of "task component" does nothing. It is a process prepared such that the 'attach' process for a child object can be executed even when the child object is treated as a "task component."
Connect ( )

The 'connect' process of "task component" does nothing. It is a process prepared such that the 'connect' process for a child object can be executed even when the child object is treated as a "task component."
Delete Connection ( )

The 'delete connection' process of "task component" does nothing. It is a process prepared such that the 'delete connection' process for a child object can be executed even when the child object is treated as a "task component."
Align The 'align' process of "task component" does nothing. It is a process prepared such that the 'align' process for a child object can be executed even when the child object is treated as a "task component,"
Generate Icon (coordinate position, display region)

It references the 'display image' attribute to display the icon at the positional coordinates provided by an argument on the display region provided by an argument.
Acquire Icon Size (entry point of size data in X-axis direction, entry point of size data in Y-axis direction)

The 'acquire icon size' process first stores the size of icon to be displayed in X-axis direction in a region pointed by the entry point of X-axis direction size data of an argument. Then, it stores the size of icon to be displayed in Y-axis direction in a region pointed by the entry point of Y-axis direction size data of an argument.

"Begin":
[Parent object]: Task component
[Association relationship]: None
[Attribute]: None
[Process]:
Execute (entry point of string of test result corresponding to test item)

The 'execute' process of "begin" is a process which is executed when the "begin" icon is pointed. It detects a "test plan" which associates the "begin," and execute the 'execute' process of the detected "test plan."

"End":
[Parent object]: Task component
[Association relationship]: None
[Attribute]: None
[Process]: None "Pause":
[Parent object]: Task component
[Association relationship]: None
[Attribute]: None
[Process]:
Execute (entry point of string of test result corresponding to test item)

It stops the program until there is input from the pointing device 30.

"Wait":
[Parent object]: Task component
[Association relationship]: None
[Attribute]:
Wait Time It is a region for storing. a period of time waiting for a program.
[Process]:
Execute (entry point of string of test result corresponding to test item)

It waits for a program for a period of time specified in the 'wait time' attribute.

"Wait until specified time":

[Parent object]: Task component
[Association relationship]: None
[Attribute]:
Start Time
  It is a region for storing the time to start the program.
[Process]:
Execute (entry point of string of test result corresponding to test item)
  It is a process for stopping the program until the 'start time' is reached.
  "Composite task":
[Parent object]: Task component
[Association relationship]:
"Task Component"
  It associates a plurality of "task components" constituting the program.
[Attribute]: None
[Process]:
Execute (entry point of string of test result corresponding to test item)
  It executes the 'execute' processes of the associated "task components" from the top of array data which stores the association relationship. However, it does not execute "begin."
Attach (entry point of "task component," coordinate position)
  The attach process performs the following processes:
(1) Execute the 'delete connection' process.
(2) Generate a copy of the "task component" provided by an argument.
(3) Specify the positional coordinates provided by an argument, and the icon region of "composite task," and execute the 'generate icon' process of the "task component."
(4) Execute the 'align' process.
(5) Execute the 'connect' process.
(6) Add the generated "task components" so that they match the display order of program element icons between the icons from "begin" to "end" being displayed, and realign the array data of entry points of program elements which the "composite task" stores as the association relationship.
Connect ( )
  It connects and displays the adjacent icons from "begin" to "end."
Delete connection ( )
  It deletes the connection display from "begin" to "end."
Align ( )
  It first connects and display the size of icons from "begin" to "end" by utilizing 'acquire size of icon' process, and modify the icon for size of the "composite task" itself to a size which can display all icons. Then, it aligns the icons from "begin" to "end" so that they can be connected and displayed. Finally, if there is a "composite task" which associates the "composite task" itself, it executes the 'align' process for the associating "composite task."
  "Loop":
[Parent object]: Composite task
[Association relationship]: None
[Attribute]:
Number of Loops
  It is a region for storing the number of loops.
[Process]:
Execute (entry point of string of test result corresponding to test item)
  It executes the 'execute' process of the included "composite task" in the number specified by 'number of loops.'
Generate Icon (coordinate position, display region)
  It displays the icons having a loop image and an input panel at the positional coordinates provided by an argument on the display region provided by an argument.
  "Switch":
[Parent object]: Composite task
[Association relationship]: None
[Attribute]:
Execution Condition
  It is a region for storing the execution condition as a string.
[Process]:
Execute (entry point of string of test result corresponding to test item)
  The 'execution condition' attribute consists of a string consisting of numerical values, equal sign, and negative sign. The 'execute' process first determines according the 'execution condition' attribute whether a numerical value corresponding to a string of test result corresponding to a test item provided by an argument is, for example, larger than a certain numerical value, or within a rang between an upper limit value and a lower limit value. Then, the 'execute' process, when the condition provided by the 'execution condition' attribute is satisfied, executes 'execute' process of the included "composite task."
Generate Icon (coordinate position, display region)
  It displays the icons having a branch image and an input panel at the positional coordinates provided by an argument on the display region provided by an argument.
  "Conditional loop":
[Parent object]: Composite task
[Association relationship]: None
[Attribute]:
Completion Condition
  It is a region for storing a condition completing a loop as a string.
[Process]:
Execute (entry point of string of test result corresponding to test item)
  The 'completion condition' consists of a string consisting of numerical values, equal sign, and negative sign.
  The following is detail of processing of 'execute' process.
(1) Execute the 'execute' process of the included "composite task" to obtain a string of test result corresponding to the test item provides as the result of the process.
(2) Then, perform determination provided by the 'completion condition' attribute on whether a numerical value corresponding to the obtained string is, for example, larger than a certain numerical value or within a range between an upper limit value and a lower limit value.
(3) Complete the process when the 'execute' process satisfies a condition provided by the 'completion condition' attribute. If the condition is not satisfied, repeat the process from (1).
Generate Icon (coordinate position, display region)
  It displays the icons having a branch image and an input panel at the positional coordinates provided by an argument on the display region provided by an argument.
  "Test plan":
[Parent object]: Composite task
[Association relationship]:
"Composite Task"
  It associates a plurality of "task components" which are available program elements.
[Attribute]:
Base Canvas of Test Plan
  It is a region for storing a display region on the graphical display which the test plan utilizes on the memory 26.

Program Element Display Canvas

It is a region for storing a display region on the base canvas of test plan for displaying an available program element on the memory.

Test Plan Canvas

It is a region for storing a display region on the base canvas of test plan for creating a program on the memory.

[Process]:

Initialize Test Plan ( )

The 'initialize test plan' process performs the following processes:

(1) Execute the 'generate display region' process;
(2) Generate a program element available for a program, and set it in the association relationship of the "composite task" of the "test plan." Then, it displays the available program element on a region indicated by the 'program element display canvas' attribute.
(3) Generate "begin" and "end," and set the generated "begin" and "end" in the association relationship of the included "composite task." Then, generate the icons of "begin" and "end," and display them on the test plan canvas.
(4) Execute the 'align' process.
(5) Execute the 'connect' process.

Generate Display Region ( )

It generates display regions corresponding to the 'base canvas of test plan,' 'program element display canvas," and "test plan canvas' attributes on the graphical display, and stores them in each attribute.

Display Available Program Element (display region)

It generates an icon of "test condition file name" being associated on the display region provided by an argument.

Execute (entry point of string of test result corresponding to test item)

It executes the 'execute' process of the included "composite task."

Now, there is described various process example implemented by using each object described above. With this connection, the following. outlines specification of a test goal and process for starting a test when each object described above is utilized. In addition, since detail of each process is described for the process of each object, the following shows how each object is started.

Figure 14:
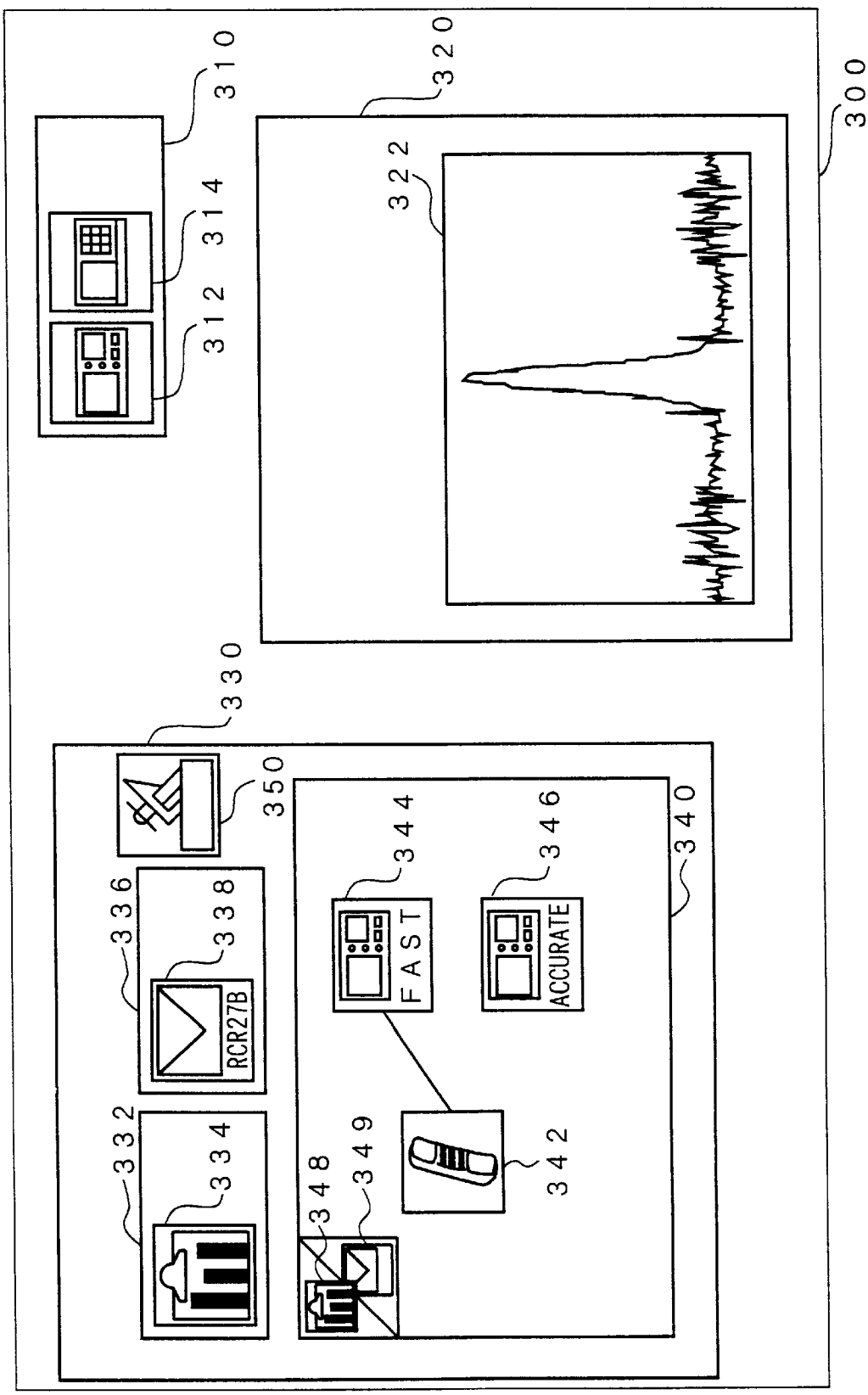
FIG. 14 shows an example of a Graphic User Interface (GUI) implementation in a testing system which starts operation through selection of a test purpose/goal.

(1) Process Example of Testing System which can Specify Whether the Test is Conducted at a High Speed or a High Accuracy, and which can Start the Operation Through Selection of Test Purpose/goal (1.0) Implementation Example of GUI Intesting System which can Start the Operation Through Selection of Test Purpose/goal FIG. 14 shows an example of GUI implementation in a testing system which can start operation through selection of a test purpose/goal. As shown in the figure, a base canvas of test task 300 includes a test element display canvas 310, a test data display canvas 320, and a test task canvas 330.

The base canvas 300 is a partial or entire display region on the graphical display which is utilized for setting a test purpose/goal for execution of the test and for displaying a test result. In addition the test element display canvas 310 is a display region on the base canvas of test task 300 for displaying the test element which can be utilized in the testing system of the embodiment.

The test data display canvas 320 is a display region on the base canvas of test task 300 for displaying test data. Moreover, a region 322 for displaying test data is secured in the test data display canvas 320.

The test task canvas 330 is a display region on the base canvas of test task 300 for specifying a test goal and for starting the test. This test task canvas 330 comprises a test item canvas 332 for displaying a test item, a test condition canvas 336 for displaying a test condition file name, a workspace 340 for displaying a DUT, the selected test item and test condition, test elements corresponding to high speed test or high accuracy test or the like, and being utilized for connection between icons of DUT, test elements corresponding to high speed test or high accuracy test or the like, and an icon of "test task" 350 for selecting a test task as a program element.

Each of these display regions is generated by the 'generate display region' process of the "test task." Then, there are generated icons 312 and 314 of "test element names" representing test elements in the test element display canvas 310, an icon of DUT 342 in the workspace 340, thereby the system being waiting for the operation by the user of the testing system.

Then, when the user of the testing system drags an icon of "test element name" representing a test element from the test element display canvas 310, and drops it on the workspace 340, icons 344, 346 of "test element names" corresponding to the high speed test and the high accuracy test are displayed on the workspace 340, while an icon 334 of "test item" available for each test element is displayed on the test item canvas 332.

In such state, when the icon of "test item" 334 on the test item canvas 310 is dragged and dropped to and on the workspace 340, the icon of "test item" 334 is erased, and an icon of "test item" 348 is newly displayed on the workspace 340. At the same time, an icon 338 of "test condition file name" or the like available for the "test item" is displayed on the test condition canvas 336.

When the icon of "test condition file name" 338 displayed on the test condition canvas 336 is dragged and dropped to and on the workspace 340, the icon of "test condition file name" 338 is erased, while an icon of "test condition file name" 349 is generated on the workspace 340.

The test item canvas 332 and the test condition canvas 336 have many icons, and if they cannot be contained in these display regions, a scroll bar displayed on part of them allowing scrolling.

Then, when the DUT icon 342 is dragged and dropped to and on either one of icons 344 or 346 corresponding to the high speed test or the high accuracy test, the DUT icon 342 is connected to and displayed with the dropped icon, so that the high speed test or the high accuracy test is conducted. That is, one drag-and-drop operation of the DUT icon 342 enables it to select the high speed test or the high accuracy test, and to instruct conduction of the test.

When the test is conducted, the test data display canvas 320 is displayed, and a graph is displayed at a stage where the test data is acquired.

(1.1) Process for Specifying Test Goal, and Starting Test

Figure 15:
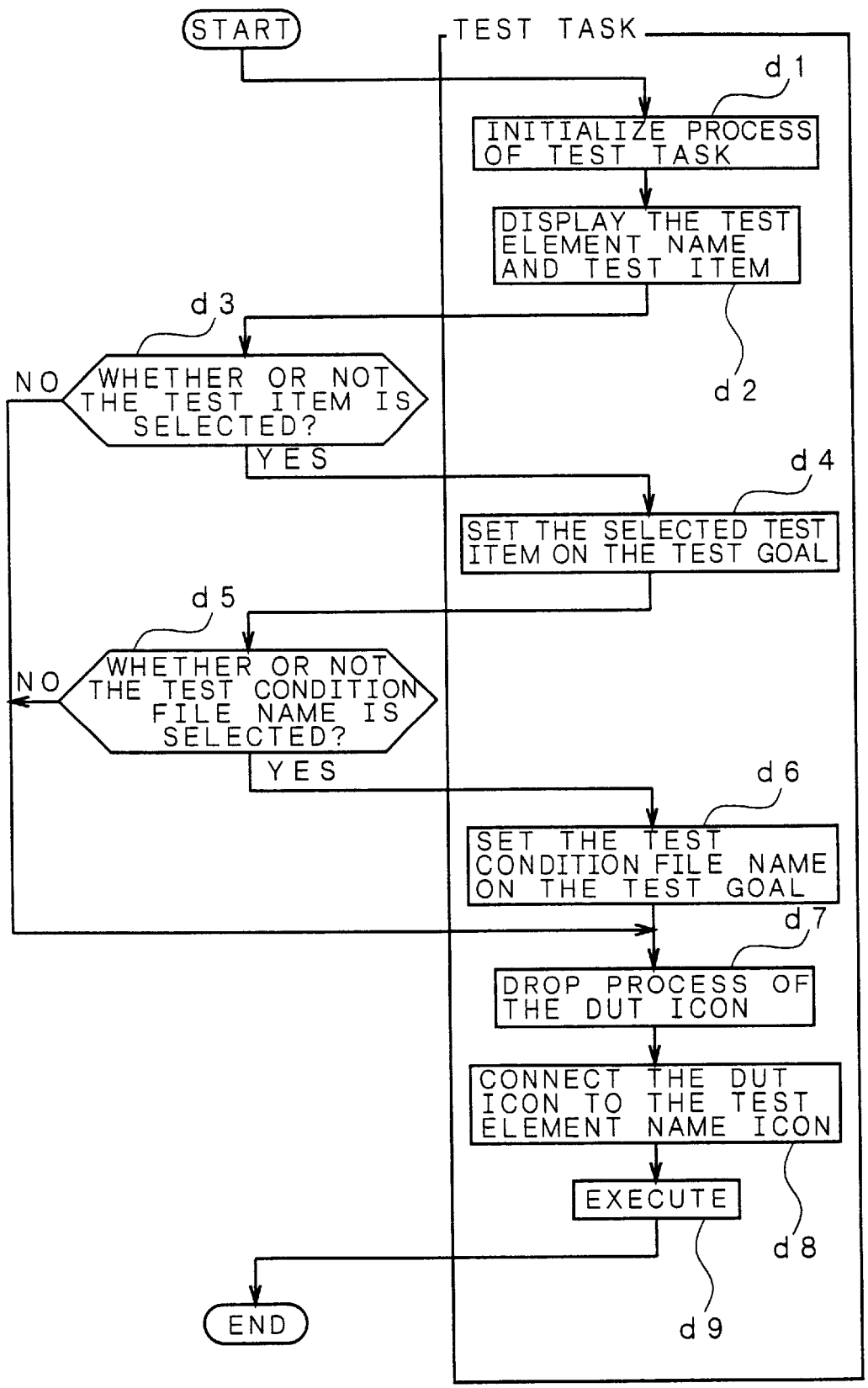
FIG. 15 is a flowchart showing an operation procedure when starting a test by specifying a test goal.

FIG. 15 is a flowchart showing an operation procedure when starting a test by specifying a test goal. First, the initialize process of test task (step d1) displays the base canvas of test task 300, the test element display canvas 310, the test item canvas 332, the test condition canvas 336, and the workspace 340 shown in FIG. 13 on the graphics display, and also displays an icon of available "test element name" on the test element display canvas 310.

In such state, when the icon of "test element name" on the test item canvas 310 is dragged and dropped to and on the workspace 340, an icon of "test element name" corresponding to the high speed test or the high accuracy test is displayed on the workspace 340, while an icon of "test item" available to the test element is displayed on the test item canvas 332 (step d2).

Then, the operation divided depending on whether the user of the testing system selects a "test item" (step d3). If a "test item" is not selected, the operation proceeds to step d7, which is described later. In addition, when a "test item" is selected, that is, when an icon of "test item" on the test item canvas 332 is dragged and dropped to and on the workspace 340, the test task sets the selected "test item" on the "test goal" (step d4), erases the icon of the selected "test item" on the test item canvas 332, and displays the icon of the selected "test item" on the workspace 340. At the same time, an icon of available "test condition file name" available for the "test item" is displayed on the test condition canvas 336.

Then, when the user of the testing system drags and drops an icon of "test condition file name" on the test condition canvas 336 to and on the workspace 340 to select the "test condition file name" (step d5), the test task sets the selected "test condition file name" at the "test goal" (step d6), erases the icon of the selected "test condition file name" on the test condition canvas 336, and displays the icon of the selected "test condition file name" on the workspace 340.

When the user selects neither a "test item" nor "test condition file name," and a DUT icon is dragged and dropped to and on the workspace 340 (step d7), the high speed test is set to the "test tradeoff" which the "test goal" has if there is an icon of "test element name" corresponding to the high speed test at the position where the DUT icon is dropped. In addition, if there is an icon of "test element name" corresponding to the high accuracy test at a position where the DUT icon is dropped, the high accuracy test is set to the "test tradeoff" which the "test goal" has.

Then, the DUT icon is connected to the "test element name" which exists at the position where the DUT icon is dropped (step d8), and the execute process of an applicable test is started (step d9).

(1.2) Alignment for Displaying Test Data by Executing Test

Figure 16:
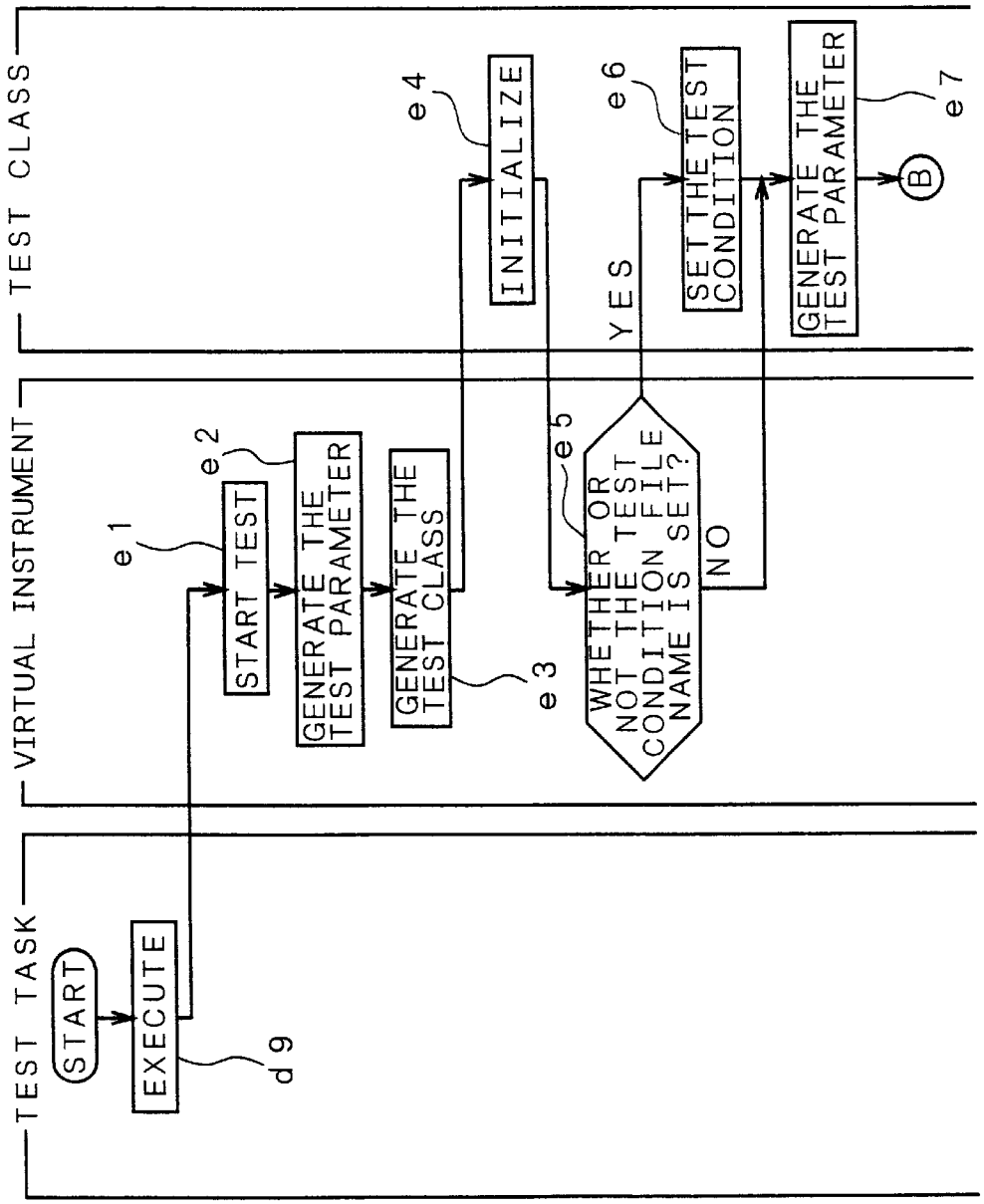
FIG. 16 is a flowchart showing an operation procedure when displaying test data as a result after conducting a test.
Figure 17:
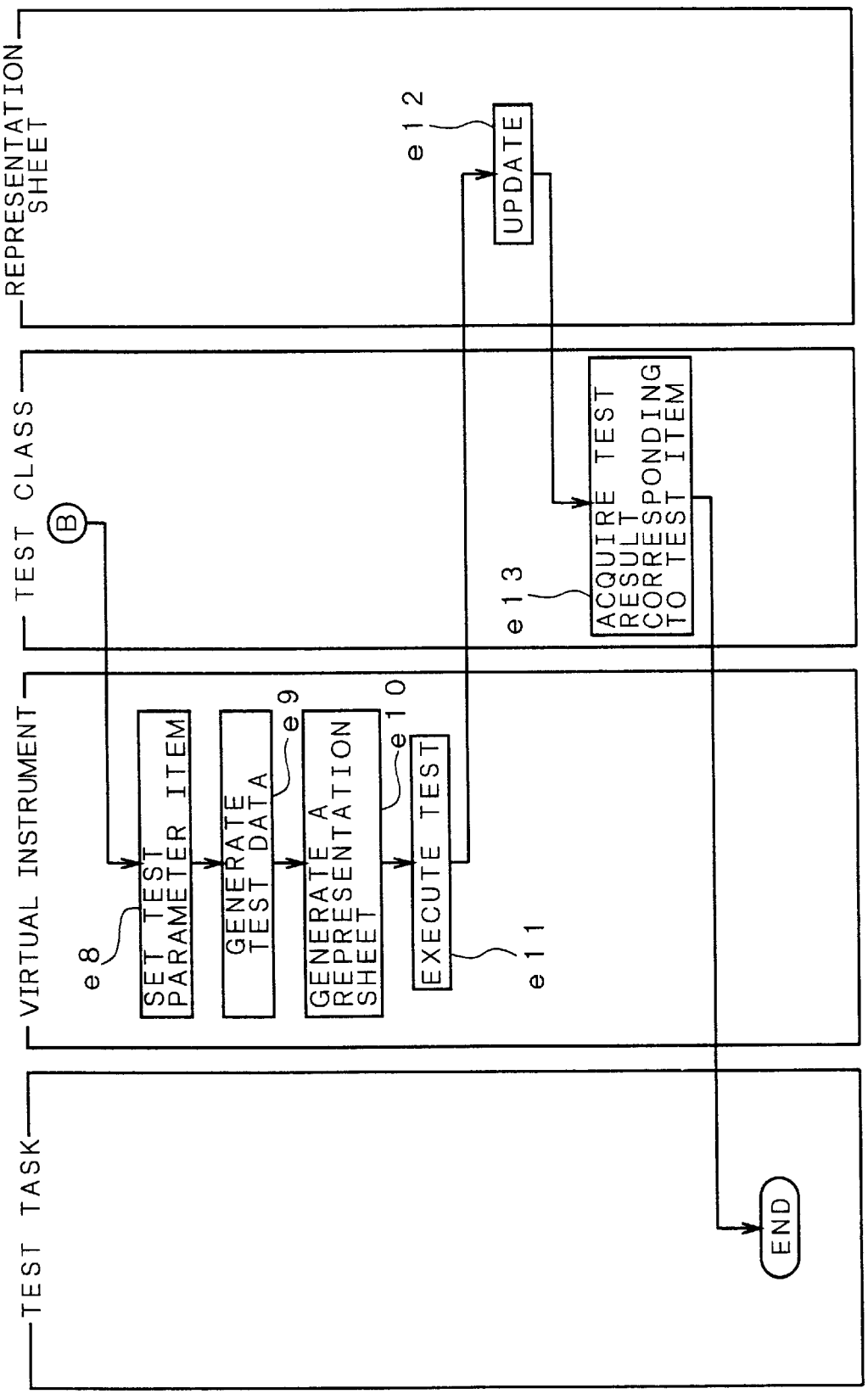
FIG. 17 is a flowchart showing an operation procedure when displaying test data as a result after conducting a test.

FIGS. 16 and 17 are a flowchart showing an operation procedure when displaying test data as a result after conducting a test. A series of operations shown in these figures are performed in response to the execution of test at step d9 of FIG. 15.

When the execute process of test is started at step d9 of FIG. 15, the test task executes the 'start test' process of the "virtual instrument" (step e1). The operation of each step after this corresponds the 'start test' process of the "virtual instrument." In addition, the 'start test' process of the "virtual instrument" is set with the already generated "test goal" as an argument.

First, the "virtual instrument" generates a "test parameter" (step e2), and sets a "test parameter item" in the generated "test parameter." In addition, the content of "test goal" is referenced, and the corresponding "test class" is generated (step e3).

Then, the generated "test class" executes the 'initialize' process (step e4). Thereafter, the "test task" determines whether or not the "test condition file name" is set in the "test goal" (step e5), and, if it is set, the "test class" executes the 'set test condition' (step e6) to set the test condition indicated by the "test condition file name" to the "test class."

In addition, the 'start test' process of the "virtual instrument" executes the 'generate test parameter' of the generated "test class" to set the content of the generated "test parameter" (step e7). This 'generate test parameter' process of the "test class" utilizes the 'set test parameter item' process of the "virtual instrument" to set the generated test parameter in the content of "test parameter" (step e8). When the test parameter is prepared, the 'start test' process of the "virtual instrument" generates "test data" for storing data obtained from the test element (step e9), and generates a 'representation sheet' for displaying the "test data" (step e10).

Thereafter, the 'start test' process of the "virtual instrument" executes the 'execute test' process of the "virtual instrument" (step e11) The 'execute test' process of the "virtual instrument" sends the generated "test parameter" to the test element, controls the test element to perform predetermined measurement, and acquires test data from the test element. Then, the 'execute test' process of the "virtual instrument" sets the acquired data in the "test data," and executes the 'update' process of the "representation sheet" for displaying the content of "test data" (step e12).

When display of test data completes, the 'start test' process of the "virtual instrument" executes the 'acquire test result corresponding to test item' of the generated "test class" (step e13), and obtains the test result corresponding to the test item.

Figure 18:
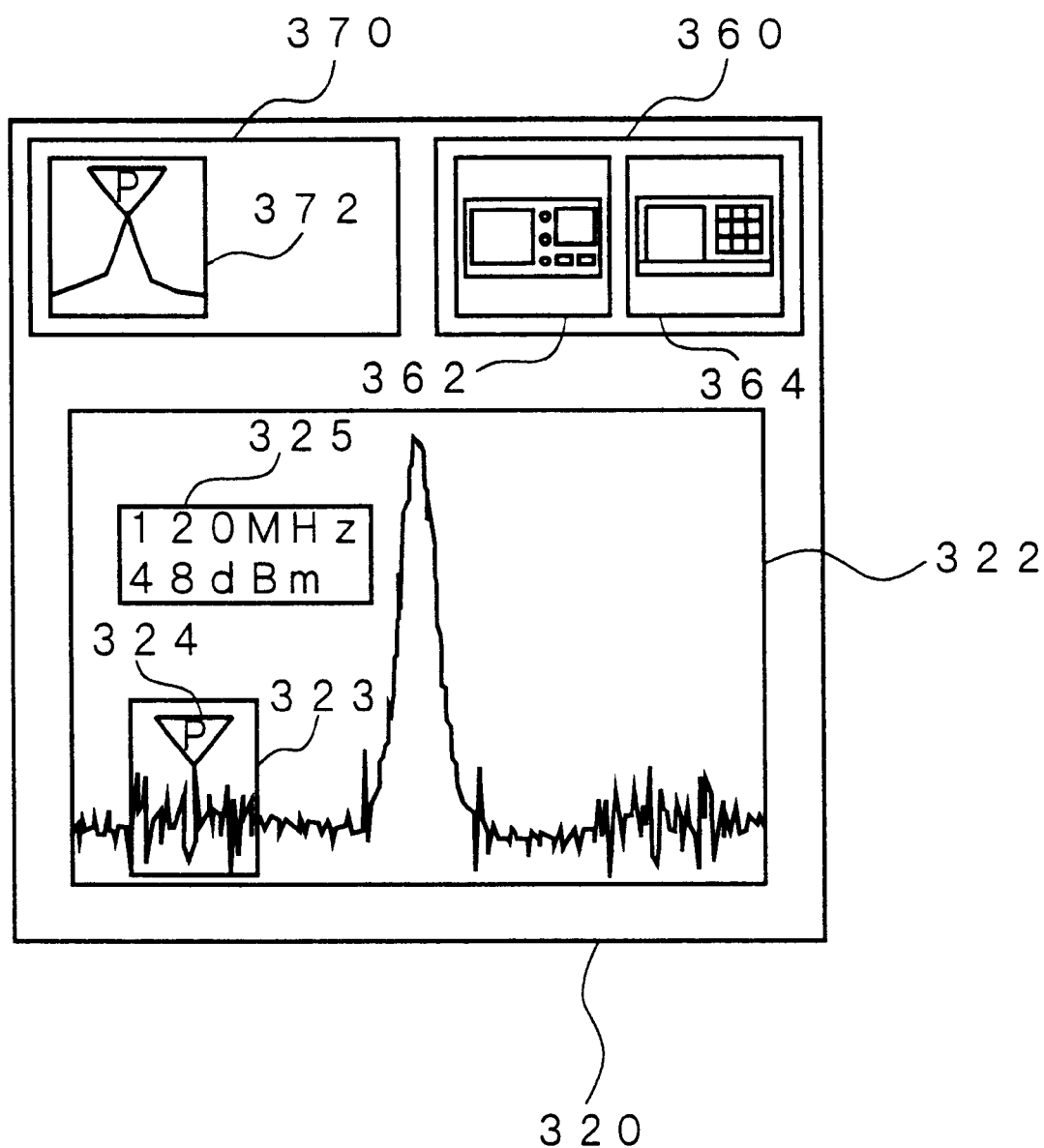
FIG. 18 is an example of GUI implementation in a testing system which starts a corresponding service when certain coordinates on a graph representation of a test result.

(2) Process Example of Function Starting Service Accommodating a Specified Range when Coordinates on Graph Representation of Test Result Obtained from Test Element (2.0) Example of GUI Implementation FIG. 18 is an example of GUI implementation in a testing system which starts a corresponding service when certain coordinates on a graph representation of a test result.

When the test is conducted, the test data display canvas 320 is displayed, and at the stage where the test data is acquired, a graph is displayed at a region 322 for displaying a part of the test data.

In such state, if the user specifies a range 323 of a part of graph, there are displayed a service selection canvas 370 which is a region for displaying the icon of available virtual instrument, and a test element selection canvas 360 which is a region for displaying available test elements on the test data display canvas 32:0. Then, icons 362 and 364 of "test element names" are displayed on the test element selection canvas 360. Moreover, icons of available "virtual instrument services" are displayed on the service selection canvas 370. FIG. 18 shows an example where an icon 372 of "peak search" which is an object derived from the "virtual instrument service" is displayed.

When the icon 372 of "peak search" on the service selection canvas 370 is dragged and dropped to and on the region 323 of a part of graph, an icon 324 representing a peak in correspondence to a peak value in the region 323 is displayed, and at the same time values 325 which are values on X- and Y-axes are displayed.

Thus, when coordinates is specified on the graph representation of test result obtained from the test element, it is possible to start a service accommodating to the specified range.

Figure 19:
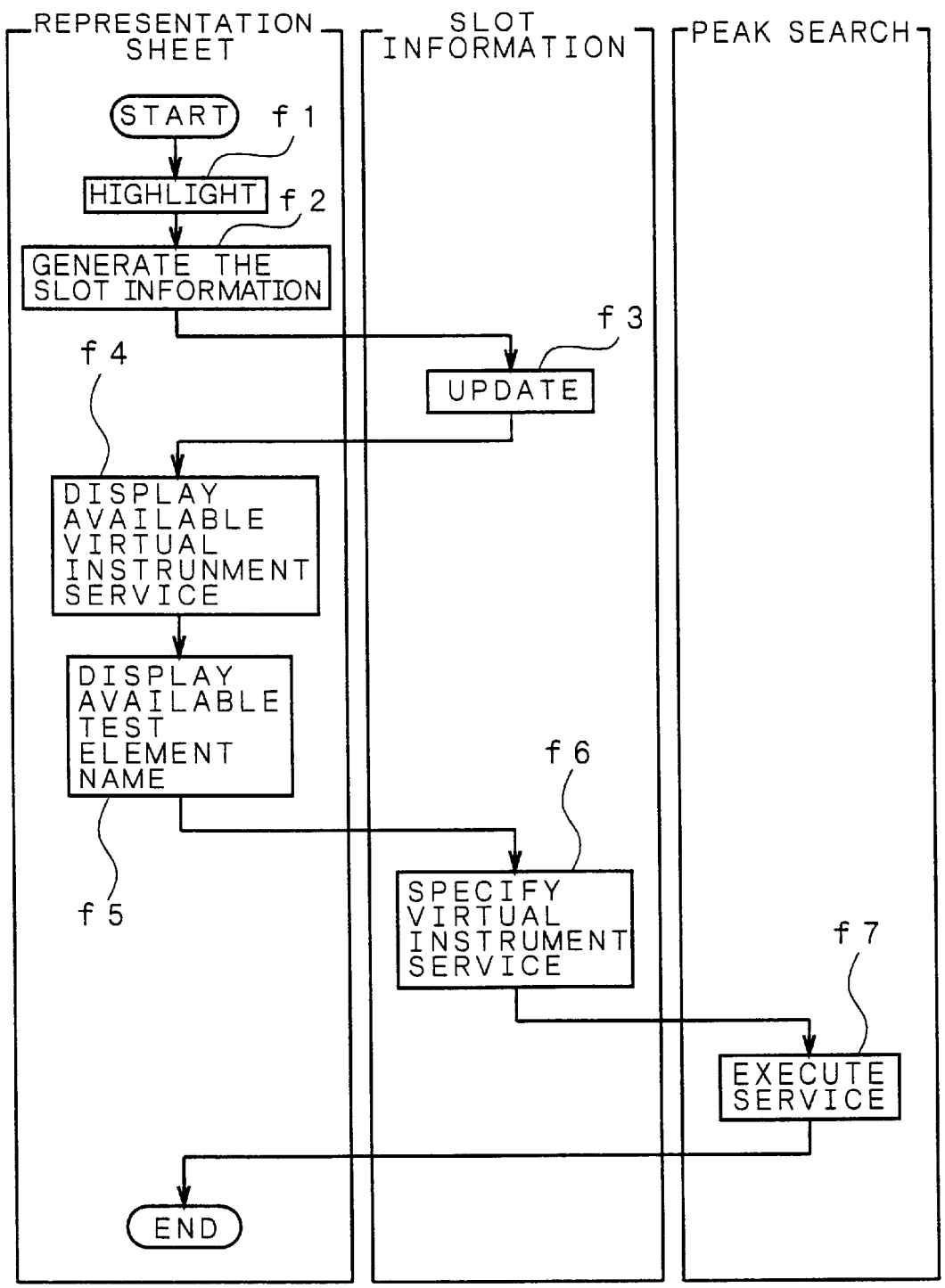
FIG. 19 is a flowchart. showing an operation procedure for performing a service for obtaining a peak value in a specified range.

(2.1) Execution of Service for Finding Peak Value in a Specified Range on Graph Representation of Test Result Obtained from Test Element FIG. 19 is a flowchart showing an operation procedure for performing a service for obtaining a peak value in a specified range.

The 'highlight' process of the "representation sheet" is executed when a range is specified on the graph representation of test result obtained from the test element (step f1). The 'highlight' process of the "representation sheet" first generates "slot information" (step f2), and executes the 'update' process of the "slot information" (step f3). The 'update' process of the "slot information" generates an outer frame of the range 323 of a part of graph on the graph representation.

Then, the 'highlight' process of the "representation sheet" executes the 'display available virtual instrument service' process of the "representation sheet" to generate a service selection canvas 370, and displays an icon 372 of the "virtual instrument service" on the generated service selection canvas 370 (step f4). In addition, the 'highlight' process of the "representation sheet" executes the 'display available test element name' process of the "representation sheet" to generate a test element selection canvas 360, and displays an icon of the "test element name" on the generated test element selection canvas 360 (step f5).

In this state, if, for example, an icon 372 of "peak search" on the service selection canvas 370 is dragged and dropped to and on a range of a part of the graph, the 'specify virtual instrument service' process of the "slot information" is executed (step f 6). Upon execution of this process, the 'execute service' process of the "virtual instrument service" is executed (step f7).

In this example, the 'execute service' process of "peak search" is executed. This process finds the peak value in the range 323 of a part of graph, and an icon representing the peak is displayed at a position corresponding to the peak value. At the same time, values on X- and Y-axes of the peak value are displayed on the graph.

(3) Process Example of Generating New Test Parameter of any Test Element from a Specified Range on Graph Representation of Test Result Obtained from Test Element, and Starting New Test with Generated Test Parameter (3.0) Example of GUI Implementation FIG. 20 is an example of GUI implementation for generating a new test parameter from a specified range on a graph representation of a test result, and starting the test.

When the test is conducted, the test data display canvas 320 is displayed, and at the stage where the test data is acquired, a graph is displayed at a region 322 for displaying a part of the test data.

In such state, if the user specifies a range 323 of a part of graph, there are displayed a service selection canvas 370 which is a region for displaying the icon of available virtual instrument, and a test element selection canvas 360 which is a region for displaying available test elements on the test data display canvas 320. Then, icons 362 and 364 of "test element names" are displayed on the test element selection canvas 360. Moreover, icon 372 of available "virtual instrument services" is displayed on the service selection canvas 370.

When the icon of "test element name" on the test element selection canvas 360 is dragged and dropped to and on the region 323 of a part of graph, an icon 326 of the "test element name" is displayed on the region 323. Subsequently, the following display operations are performed. (a) If the "test element name" does not store a test item started by default.

A test item selection canvas 380 is displayed on the base canvas of test task 300. Then, icons 382 and 384 of "test items" which can be performed the selected test item are displayed on the test item selection canvas 380. When either one of the icon 382 or 384 of the selected "test item" is pointed by the pointing device 30, a new test data display canvas 400 is generated. The test is conducted with the selected test item, and, when the test completes, a graph 410 is displayed on the test data display canvas 400. (b) If the "test element name" stores a test item started by default A new test data display canvas 400 is generated. The test is conducted with the selected test item, and, when the test completes, a graph 410 is displayed on the test data display canvas 400. Thus, a new test parameter of any test element is generated from a specified range on graph representation of a test result obtained from a test element, and new test is started with the generated test parameter.

Figure 21:
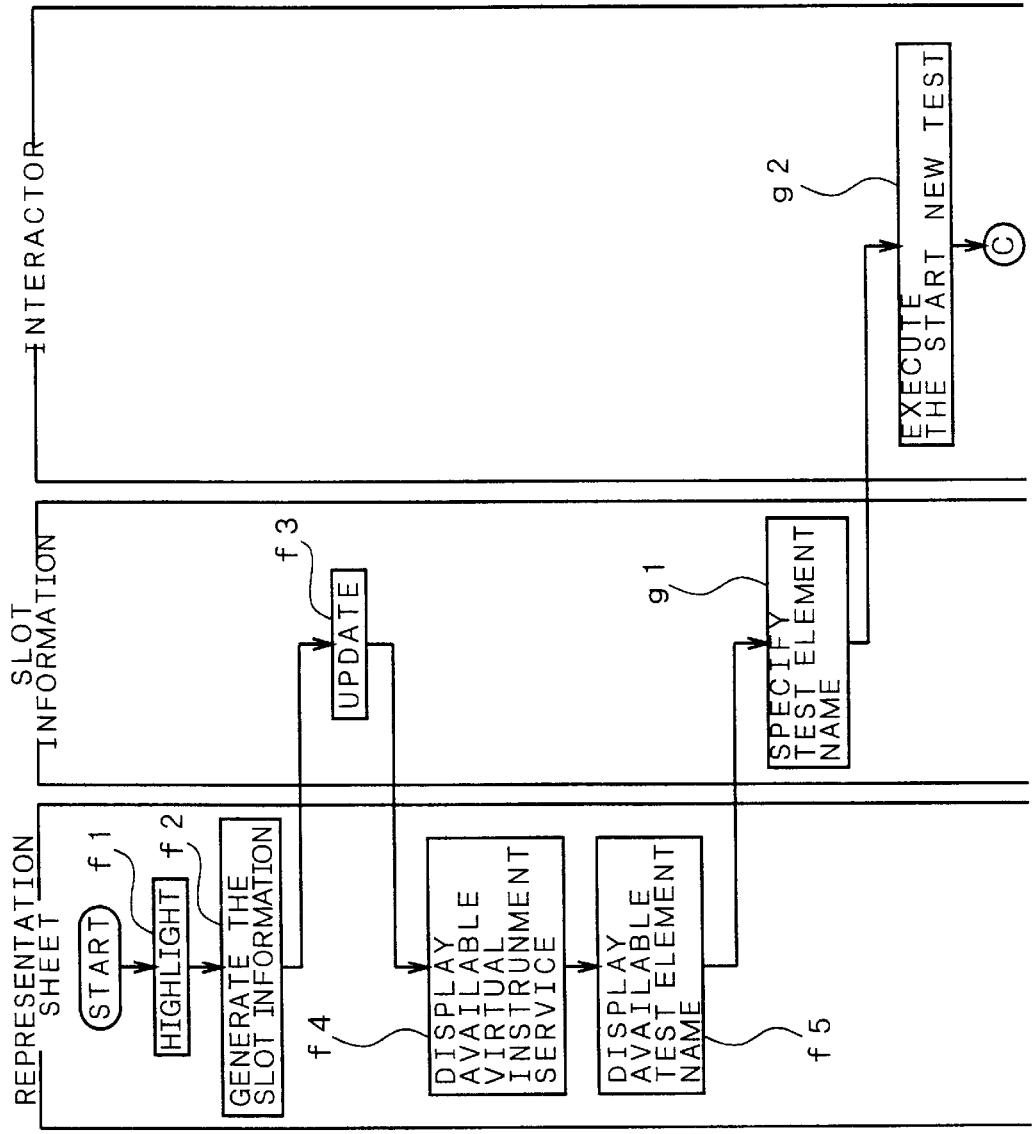
FIG. 21 is an example of GUI implementation for generating a new test parameter from a specified range on a graph representation of a test result, and starting a new test.
Figure 22:
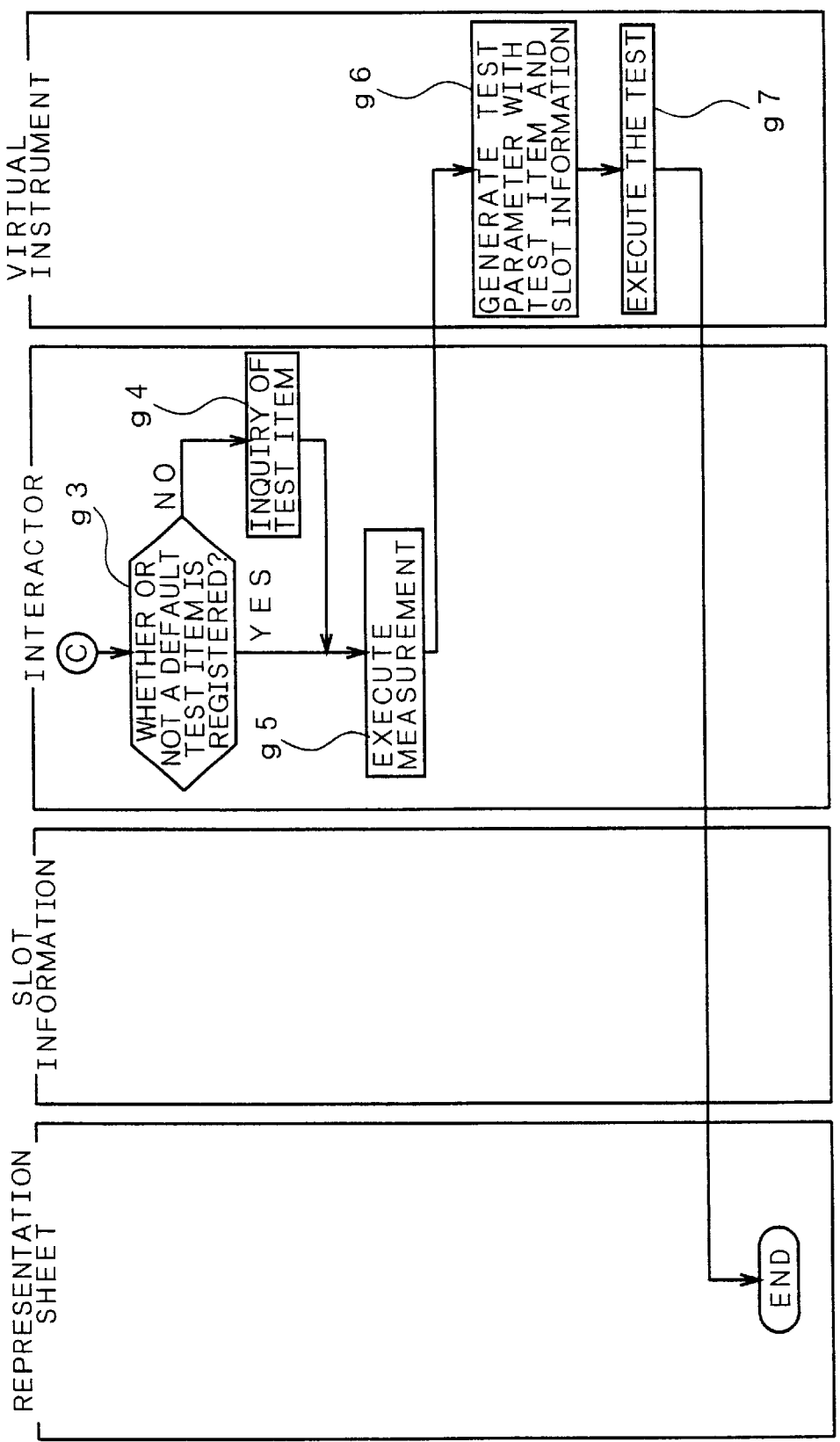
FIG. 22 is an example of GUI implementation for generating a new test parameter from a specified range on a graph representation of a test result, and starting a new test.

(3.1) Executing Process of Generating New Test Parameter of any Test Element from a Specified Range on Graph Representation of Test Result Obtained from Test Element, and Starting New Test with Generated Test Parameter FIGS. 21 and 22 are flowcharts showing an operation procedure for generating a new test parameter from a specified range on a graph representation of a test, and starting a new test result. The operation procedure of steps f1–f5 is same as the operation shown in FIG. 19, and the description is started with the next operation procedure.

When the icon of "test element name" displayed on the test element selection canvas 360 in step f5 is dragged and dropped to and on the range 323 of a part of graph, the 'specify test element name' process of the "slot information" is executed (step g1). This 'specify test element name' process with the "slot information" executes the 'start new test' process of the "interactor" (step g2).

The 'start new test' process of the "interactor" first determines whether or not a default "test item" is registered in the selected "test element name" (step g3), and, if not, the user of the testing system is inquired with the test item (step g4). This inquiry is performed by displaying an icon 382 of "test item" which can be conducted in the test element on the test item selection canvas 380 on the base canvas of test task 300.

If the default "test item" is registered, or if the user points the icon 382 of the "test item" displayed on the test item selection canvas 380 or the like with the pointing device 30 in response to the inquiry, the 'execute measurement' process of the "interactor" is executed (step g5). The 'execute measurement' process of the "interactor" first execute the 'generate test parameter with test item and slot information' process of the "virtual instrument" (step g6) to generate a new "test parameter," "test data," and "representation sheet." The "test class" is utilized for this generation of "test parameter." Then, the 'execute measurement' process of the "interactor" executes the 'execute test' process of the "virtual instrument," thereby measurement being performed with the new measurement parameter.

Figure 23:
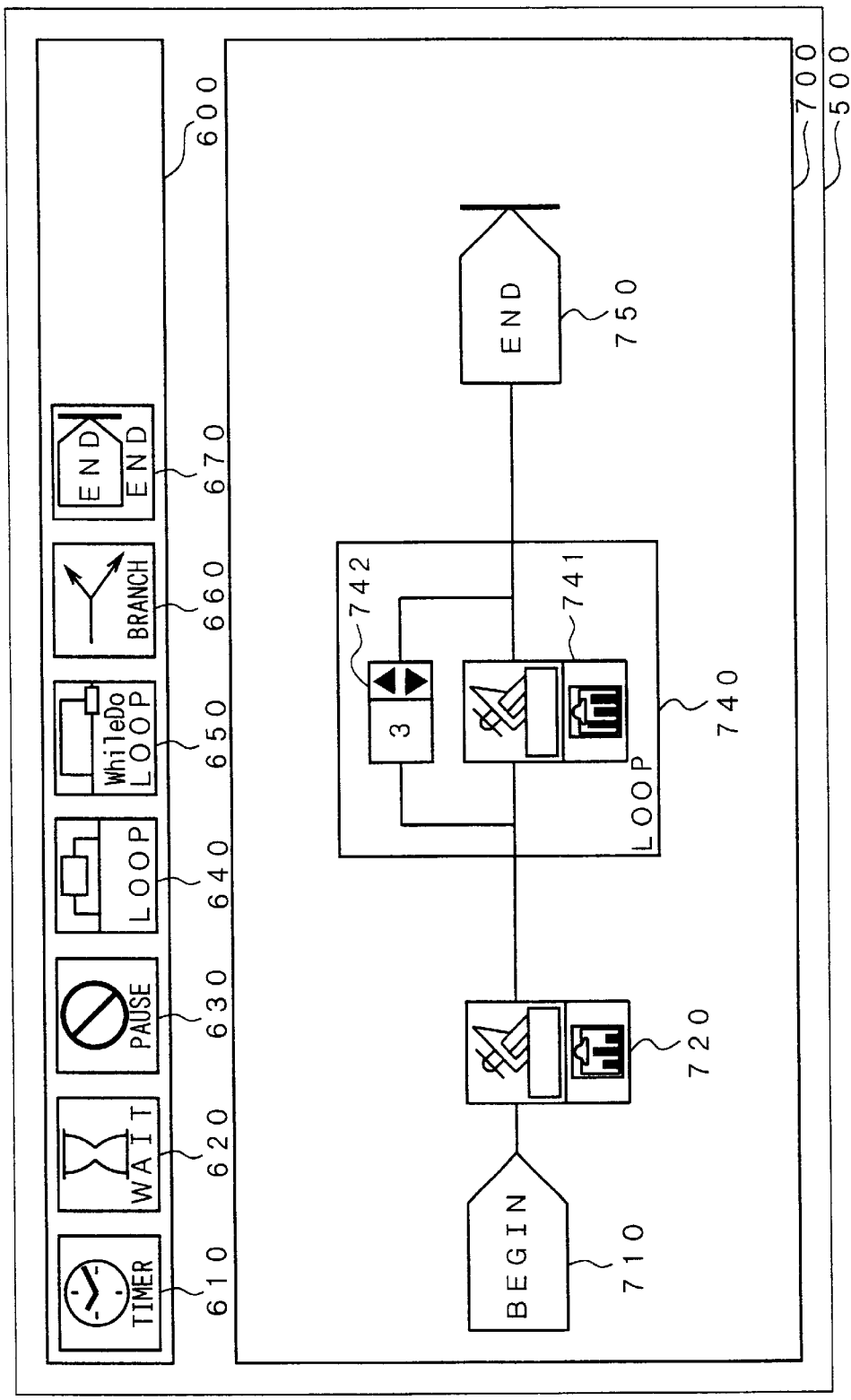
FIG. 23 is an example of GUI implementation for creating and running a program.

(4) Process Example for Creating Program (4.0) Example of GUI for Creating Program FIG. 23 is an example of GUI implementation for creating and running a program. As shown in the figure, the base canvas of test plan 500 comprises a program element display canvas 600 and a test plan canvas 700.

The base canvas of test plan 500 is a partial or entire display region on the graphical display for creating a program and executing the created program. The program element display canvas 600 is a display region on the base canvas of test plan 500 for displaying available program elements. The test plan canvas 700 is a display region on the base canvas of test plan 500 for creating a program.

At starting a program, there is provided program element icons 610–670 on the program element display canvas 600, and a "begin" icon 710 and an "end" icon 750 on the test plan canvas 700 (the icons of "begin" and "end" being connected and displayed).

To register a "test task" in the program, the icon 350 of "test task" on the test task canvas 330 of FIG. 14 is dragged and dropped to and on the test plan canvas 700. Then, an icon of "test task" 720 is generated on the test plan canvas 700.

In addition, to select a program element for controlling an order of execution of "test tasks," an icon of test element on the program element display canvas 600 is dragged and dropped to and on the test plan canvas 700. For example, an icon of "loop" 640 is dragged from the program element display canvas 600 and dropped on the test plan canvas 700. When the icon of "loop" 640 is dropped on the test plan canvas 700, an icon of "loop" 740 and an input part 742 for specifying the number of loop are displayed.

To specify a "test-task" which is repeatedly executed, the icon of "test task" 350 is dropped. on the icon of "loop" 740. When the icon of "test task" 350 is dropped on the icon of "loop" 740, an icon of "test task" 741 is generated on the icon of "loop" 740.

To run the thus created program, the icon of "begin" 710 is pointed by the pointing device 30. Then, the test task 720 is executed, followed by execution of the "loop." When the "loop" is executed, the included "test task" is executed by the number input with the input part 742 (it being executed three times in this example).

Thus, a program can be created, and the created program can be run.

(4.1) Creation of Program

Figure 24:
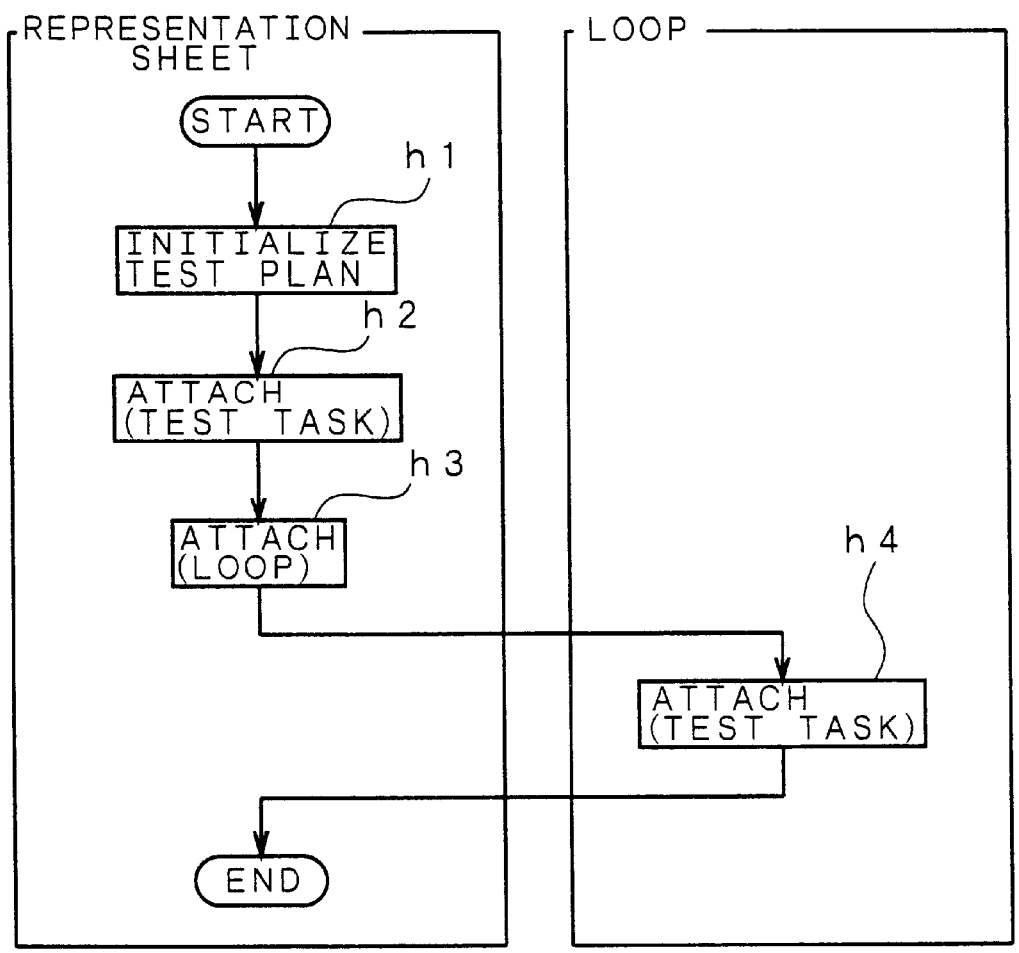
FIG. 24 is a flowchart showing an operation procedure in creating a program.

FIG. 24 is a flowchart showing an operation procedure in creating a program. It shows the procedure of program creation described using FIG. 23.

First, the "test plan" performs the 'initialize test plan' process (step h1) to generate the state of GUI when starting the program. The 'attach' process of the "composite task" included in the "test plan" is executed (step h2). This process is started by dragging the icon of "test task" 350 shown in FIG. 14, and dragging it on the test plan canvas 700. As the result of the 'attach' process of the "composite task" included in the "test plan," an icon of "test task" 720 is displayed.

Then, the 'attach' process of the "composite task" included in the "test plan" is executed (step h3). This process is started by dragging the icon of "loop" 640 from the program element display canvas 600 and dropping it on the test plan canvas 700. As the result of the 'attach' process of the "composite task" included in the "test plan," a "loop" is generated, and an icon of "loop" 740 including an icon of input part 742 is displayed.

Then, the 'attach' process of the "composite task" included in the generated "loop" is executed (step h4). This is started by dropping the icon of "test task" on the icon of "loop" 740. As the result of the 'attach' process of the "composite task" included in the "loop," the icon of "test task" 741 is displayed on the icon of "loop" 740.

(4.2) Execution of Program

Figure 25:
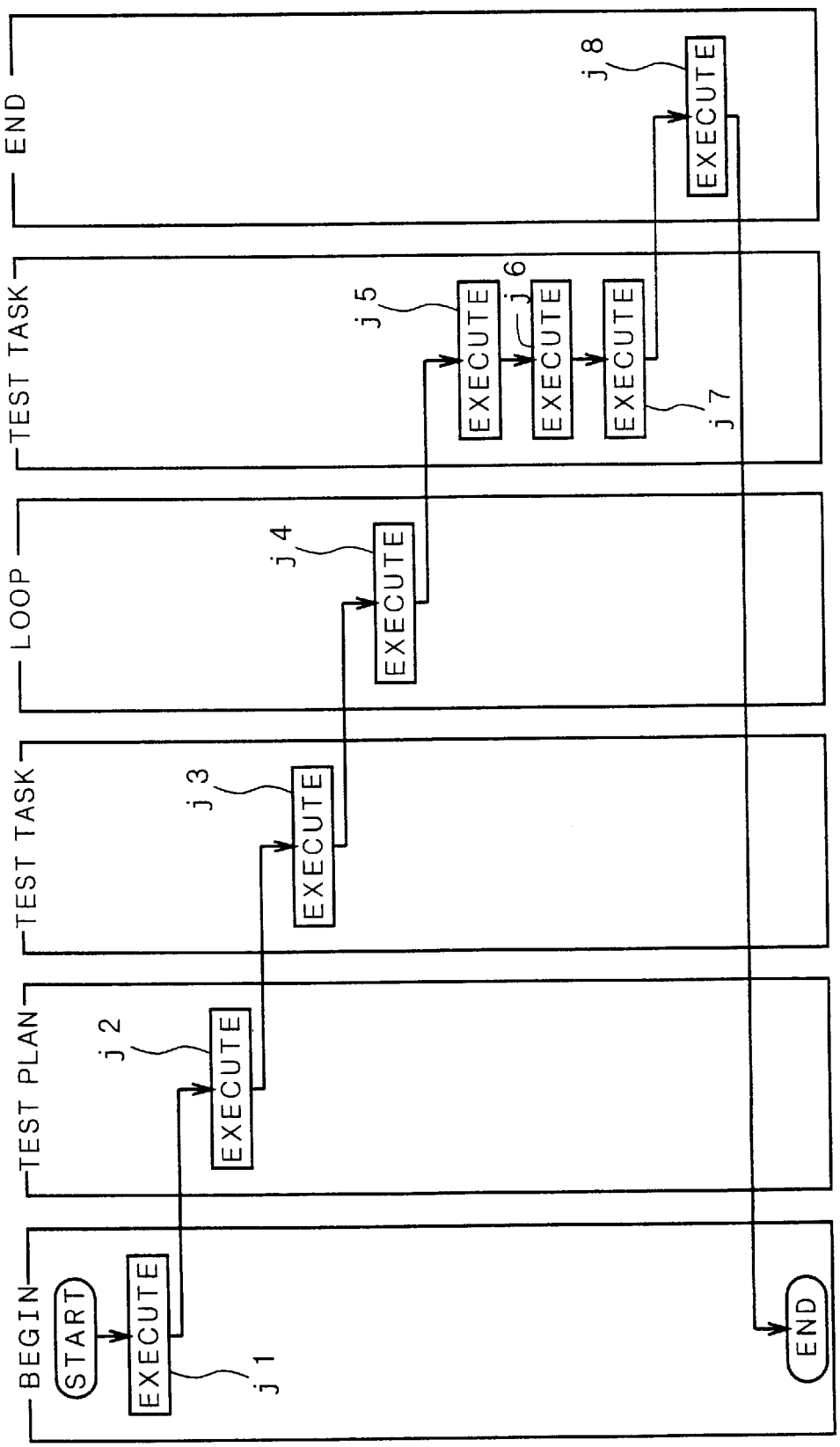
FIG. 25 is a flowchart showing an operation procedure in running a program.

FIG. 25 is a flowchart showing an operation procedure in running a program. It shows the procedure of executing the program described using FIG. 23.

First, the 'execute' process of "begin" is executed (step j1). This is started by pointing the icon of "begin" 710 with the pointing device 30. The 'execute' process of "begin" detects a "test plan" which associates the "begin," and executes the 'execute' process of the detected "test plan" (step j2). An 'execute' process of the "test plan" executes the 'execute' process of the included "composite task." The 'execute' process of the "composite task" executes the 'execute' processes of the "task components" being associated in an order from the top of the array data which associate the association relationship. However, it does not execute "begin." In this example, the program element at the top of array data is "begin." Thus, the next one associated in the "composite task" included in the "test plan" is the "test task" corresponding to the icon 720. Therefore, the 'execute' process of the "test plan" executes the 'execute' process of the "test task" corresponding to the icon 720 (step j3).

In addition, a program element which the "composite task" included in the "test plan" associates next to the "test task" corresponding to the icon 720 is the "loop." Thus, the 'execute' process of the "test plan" executes the 'execute' process of the "loop" (step j4).

The 'execute' process of the "loop" executes the 'execute' process of the "composite task" included in the "loop" by the number of loops. In this example, the number of loops is three, and the program element associated by the "composite task" included in the "loop" is only the "test task" represented by the icon 741. Thus, the 'execute' process of the "test task" is executed three times (steps j5–j7).

In addition, a program element which the "composite task" included in the "test plan" associates next to the "loop" is "end." Thus, it executes the 'execute' process of "end" (step j8). Thereafter, since the "composite task" included in the "test plan" does not associate any other program element, the 'execute' process of the "test plan" completes.

As described above, the GUI generating/managing section 34 included in the GUI processing section 100 of the testing system according to the embodiment has functions as test task means, test parameter means, test data storage means, virtual instrument means, representation sheet means, test class means, slot information means, virtual instrument service means, interactor means, and test plan means, and can (1) start operation by selecting an object or goal of the test, (2) specify whether a test is conducted at a high speed or at a high accuracy, (3) start a service adapted to a specified range without reprogramming a program when certain coordinates are specified on a graph representation as a test result, (4) generate a new test parameter of a test element from a specified range on a graph representation of the result obtained from the test element without reprogramming a program, and start a new test with the generated test parameter, and (5) can generate a new test parameter of another test element from a specified range on a graph representation of the result obtained from the test element without reprogramming a program, and start a new test with the generated test parameter.

What is claimed is:

1. A method for controlling a testing system for performing an operation of an application which controls testing equipment for testing a device under test by displaying images on a screen, and selecting said images with the use of a pointing device, said method comprising the steps of:

a) displaying a first icon representing the device under test on a first display region contained in a display screen;

b) displaying a second icon representing a selected test element on said first display region;

c) connecting and displaying said first icon and said second icon on said first display region;

d) generating a test parameter for said selected test element;

e) conducting a predetermined test by setting said test parameter generated in said step d, and acquiring test data from said selected test element; and f) displaying said test data acquired in said step e on said first display region; and, further comprising, after or in parallel to said step b:

g) displaying a third icon on said first display region, said third icon corresponding to said selected test element, and being identifiable from said second icon; wherein said second icon and said third icon are used as an icon representing said selected test element corresponding to either of a high speed test or a high accuracy test.

2. The method for controlling the testing system as set forth in claim 1, further comprising, before said step c:

a step of displaying one or more of a test item icon on said first display region, said one or more test item icon representing one or more test items corresponding to said selected test element; and a step of selecting any one of said one or more test item icons displayed in said step of displaying a one or more test item icon on said first display region, thereby effecting selection of a test item.

3. The method for controlling the testing system as set forth in claim 2, further comprising, between said step of selecting any one of said one or more test item icons displayed in said step of displaying a test item icon on said first display region and said step c:

a step of displaying a test condition icon on said first display region, said test condition icon representing a test condition previously prepared in correspondence to said selected test item; and a step of selecting said test condition icon displayed in said step of displaying a test condition icon on said first display region, thereby effecting selection of a test condition.

4. The method for controlling the testing system as set forth in claim 1, comprising, in place of said step f, a step of displaying test data corresponding to said high speed test or said high accuracy test on said first display region.

5. The method for controlling the testing system as set forth in claim 1, wherein display of said test data on said first display region is attained by a graph representation in a predetermined form; and further comprising when a range is selected on the graph representation of said test data displayed on said first display region, a step of overlapping and displaying an outer frame of said selected range on said graph representation.

6. The method for controlling the testing system as set forth in claim 5, further comprising, after said step of overlapping and displaying an outer frame:

a step of displaying one or more predetermined services icons on said first display region, said predetermined services icons representing predetermined services which can be implemented on said graph representation; and a step of, when any one of said predetermined services icons is selected, performing a corresponding one of said predetermined services, and displaying a result of said performed corresponding one of said predetermined services on said first display region.

7. The method for controlling the testing system as set forth in claim 5, further comprising, after said step of overlapping and displaying an outer frame:

a step of displaying one or more implementable test element icons on said first display region, said implementable test element icons representing one or more test elements which can be implemented on said graph representation;

a step of selecting one of said implementable test element icons displayed in said step of displaying one or more implementable test element icons on said first display region, thereby selecting a test element;

a step of setting a test range out of said obtained measurement data based on positional coordinates of said selected range on the graph representation;

a step of generating a test parameter for said test element selected in said step of selecting one of said implementable test element icons;

a step of setting said test parameter generated in said step of generating a test parameter for said test element selected in said step of selecting one of said implementable test element icons in said selected test element to conduct a predetermined test, and to acquire new test data; and a step of displaying said test data acquired in said step of setting said test parameter generated in said step of generating a test parameter for said test element selected in said step of selecting one of said implementable test element icons on said first display region.

8. The method for controlling the testing system as set forth in claim 7, further comprising, after said step of displaying one or more implementable test element icons on said first display region:

a step of displaying one or more test item icons on said first display region, said test item icons representing one or more test items corresponding to said selected test element; and a step of selecting one of said test item icons displayed in said step of displaying one or more test item icons on said first display region, thereby selecting a test item; and further comprising, in place of said step of generating a test parameter for said test element selected in said step of selecting one of said implementable test element icons, a step of generating a test parameter for said test element selected in said step of selecting one of said implementable test element icons displayed in said step of displaying one or more implementable test element icons on said first display region based on said test item selected in said step of selecting one of said test item icons displayed in said step of displaying said one or more test item icons on said first display region and said test range set in said step of setting a test range out of said obtained measurement data based on positional coordinates of said selected range on the graph representation.

9. A method for controlling a testing system for performing an operation of an application which controls testing equipment for testing a device under test by displaying images en a screen, and selecting these images with use of a pointing device, said method comprising;

a first step of displaying a first icon representing the device under test on a first display region contained in a display screen;

a second step of displaying a second icon representing a selected test element on said first display region;

a third step of connecting and displaying said first icon and said second icon on said first display region;

a fourth step of generating a test parameter for said selected test element;

a fifth step of conducting a predetermined test by setting said test parameter generated in said fourth step, and acquiring test data from said test element;

a sixth step of displaying said test data acquired in said fifth step on said first display region;

a seventh step of displaying one or more program element icons representing one or more program elements on a second display region contained in said display screen or said first display region;

an eighth step of displaying a start of test icon representing start of a test and an end of test icon representing end of the test on said second display region, and connecting and displaying said start of test and end of test icons on said second display region;

a ninth step of selecting one of said program element icons displayed on said second display region or said first display region, thereby selecting a program element;

a tenth step of selecting a position for displaying one or mare of a selected program element icon between said start of test and end of test icons, said selected program element icon corresponding to said program element selected in said ninth step;

an eleventh step of deleting the connection attained in said eighth step between said start of test and end of test icons;

a twelfth step of displaying said selected program element icon at the selected position on said second display region selected in said tenth step;

a thirteenth step of aligning said start of test and end of test icons and said one or more selected program element icons after said twelfth step, said one or more selected program element icons being between said start of test and end of test icons; and a fourteenth step of connecting and displaying connections between said start of test, end of test and selected program element icons in a predetermined order after said thirteenth step.

10. The method for controlling the testing system as set forth in claim 9, wherein the order of said one or more selected program element icon between said start of test icon representing start of the test and said end of test icon representing end of the test can be changed.

11. The method for controlling the testing system as set forth in claim 9, wherein at least one of said one or more program elements contains a composite program element.

12. The method for controlling the testing system as set forth in claim 9, wherein, when said start of test icon representing start of a test is selected, said program elements to which said one or more selected program element icons correspond are executed in an order from the nearest one to said start of test icon.

* * * * *